United States Patent
Cheng et al.

(10) Patent No.: US 9,048,108 B2
(45) Date of Patent: Jun. 2, 2015

(54) INTEGRATED CIRCUIT WITH ON CHIP PLANAR DIODE AND CMOS DEVICES

(75) Inventors: Kangguo Cheng, Schenectady, NY (US); Ali Khakifirooz, Mountain View, CA (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 13/478,080

(22) Filed: May 22, 2012

(65) Prior Publication Data

US 2013/0313651 A1 Nov. 28, 2013

(51) Int. Cl.
*H01L 21/8238* (2006.01)
*H01L 27/06* (2006.01)

(52) U.S. Cl.
CPC .................................. *H01L 27/0629* (2013.01)

(58) Field of Classification Search
USPC ................................................ 438/478, 222
See application file for complete search history.

(56) References Cited

U.S. PATENT DOCUMENTS

| | | | |
|---|---|---|---|
| 6,936,895 B2 | 8/2005 | Manna et al. | 257/355 |
| 7,122,449 B2 | 10/2006 | Langdo et al. | 438/481 |
| 7,138,313 B2 | 11/2006 | Chatty et al. | 438/237 |
| 7,256,142 B2 | 8/2007 | Fitzgerald | 438/763 |
| 7,335,927 B2 | 2/2008 | Coolbaugh et al. | 257/104 |
| 7,786,650 B2 | 8/2010 | Takasan et al. | 365/148 |
| 2006/0228850 A1 | 10/2006 | Tsai et al. | 438/210 |
| 2007/0102834 A1* | 5/2007 | Enicks et al. | 257/E29.193 |
| 2007/0105265 A1* | 5/2007 | Lai et al. | 438/64 |
| 2008/0230865 A1* | 9/2008 | Hong | 257/458 |
| 2009/0000147 A1 | 1/2009 | Collins | 257/292 |
| 2009/0001417 A1 | 1/2009 | Liu et al. | 257/292 |
| 2010/0062573 A1 | 3/2010 | Gossner et al. | 438/135 |
| 2010/0289075 A1 | 11/2010 | Lin et al. | 257/355 |
| 2011/0024810 A1* | 2/2011 | Janesick | 257/292 |
| 2011/0049630 A1 | 3/2011 | Majumdar et al. | 257/351 |
| 2011/0115004 A1 | 5/2011 | Gebara et al. | 257/292 |
| 2012/0237695 A1* | 9/2012 | Pye et al. | 427/554 |
| 2013/0082330 A1* | 4/2013 | Xia et al. | 257/368 |

FOREIGN PATENT DOCUMENTS

EP 0621637 A1 10/1994 ............. H01L 27/02

OTHER PUBLICATIONS

T. Uchino et al., "A Raised Source/Drain Technology Using In-situ P-doped SiGe and B-doped Si for 0.1um CMOS ULSIs," IEDM, pp. 479-482, 1997. T. Uchino et al., "A Raised Source/Drain Technology Using In-situ P-doped SiGe and B-doped Si for 0.1um CMOS ULSIs," IEDM, pp. 479-482, 1997.

(Continued)

*Primary Examiner* — Jae Lee
(74) *Attorney, Agent, or Firm* — Ido Tuchman; Vazken Alexanian

(57) ABSTRACT

An electrical circuit, planar diode, and method of forming a diode and one or more CMOS devices on the same chip. The method includes electrically isolating a portion of a substrate in a diode region from other substrate regions. The method also includes recessing the substrate in the diode region. The method further includes epitaxially forming in the diode region a first doped layer above the substrate and epitaxially forming in the diode region a second doped layer above the first doped layer.

22 Claims, 25 Drawing Sheets

(56) References Cited

OTHER PUBLICATIONS

C. Menon et al., "Loading Effect in SiGe Layers Grown by Dichlorosilane- and Silane-Based Epitaxy," Journal of Applied Physics, vol. 90, Issue 9, 2001.

J Hallstedt et al., "Pattern Dependency in Selective Epitaxy of B-doped SiGe Layers for Advanced Metal Oxide Semiconductor Field Effect Transistors," Journal of Applied Physics, vol. 103, Issue 5, Mar. 1, 2008.

Hartmann et al., "Selective Epitaxial Growth of Si and SiGe for Metal Oxide Semiconductor Transistors," Journal of Crystal Growth, vol. 259, Issue 4, 2003.

\* cited by examiner ial Circuit with on Chip Planar Diode and CMOS Devices

BACKGROUND

The present invention relates to semiconductor devices, and more particularly to diodes and device fabrication.

Systems on chip devices are integrated circuits that include the components of a system on one substrate. A system on chip device may be formed with a variety of semiconductor based components. Furthermore, a system on chip device may include diodes. Diodes are conventionally formed by an implantation process.

BRIEF SUMMARY

An example embodiment of the present invention is a method of forming a diode and one or more Complementary Metal-Oxide-Semiconductor (CMOS) devices on the same chip. The method includes electrically isolating a portion of a substrate in a diode region from other substrate regions. The method also includes recessing the substrate in the diode region. The method further includes epitaxially forming in the diode region a first doped layer above the substrate and epitaxially forming in the diode region a second doped layer above the first doped layer.

Another example embodiment of the present invention is a planar diode. The planar diode includes a substrate and a diode region including a portion of the substrate. The diode region is electrically isolated from other substrate regions. The planar diode includes a first doped layer in the diode region above the substrate and a second doped layer in the diode region above the first doped layer. The first doped layer and the second doped layer are each epitaxial layers having a single respective crystal oriented by an orientation of the substrate.

A further example embodiment of the invention is an electrical circuit. The electrical circuit includes a substrate and a diode region including a portion of the substrate. The diode region is electrically isolated from other substrate regions. The electrical circuit includes a first doped layer above the substrate in the diode region and a second doped layer above the first doped layer in the diode region. The first doped layer and the second doped layer are each epitaxial layers having a single respective crystal oriented by an orientation of the substrate. The first doped layer and the second doped layer are configured together as a diode. The electrical circuit also includes a pFET above an n doped region in the substrate and an nFET above a p doped region in the substrate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-25. As discussed in detail below, embodiments of the present invention include an electrical circuit, planar diode, and methods for form forming a diode and one or more Complementary Metal-Oxide-Semiconductor (CMOS) devices on the same chip. Embodiments of the invention may take advantage of epitaxy processes to form defect-free epitaxy diodes. These epitaxy processes may be used for forming high performance PDSOI or bulk FETs with embedded source/drains. One potential advantage of embodiments of the invention is the formation of a defect-free epitaxy diode that has low leakage current. Another potential advantage of embodiments of the invention is the formation of thick epitaxial layers in the diode by taking advantage of epitaxy loading effects. As used herein, unless otherwise specifically indicated, the term "doped" and its variants refers to lightly doped, moderately doped, heavily doped or any other level of doping understood by those of ordinary skill in the art.

Figure 1:
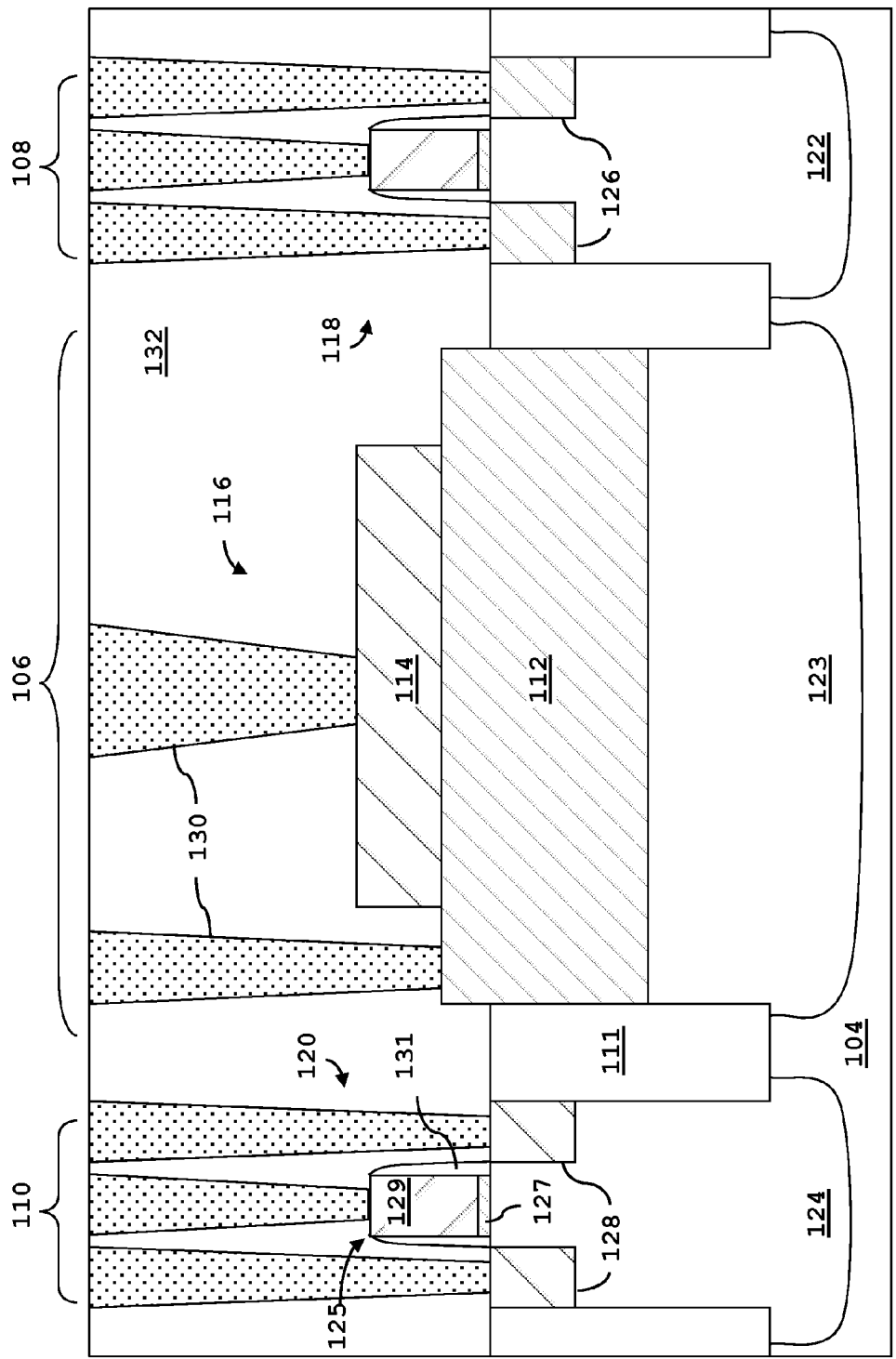
FIG. 1 shows a cross-sectional side view of an example embodiment of an electrical circuit.

FIG. 1 shows a cross-sectional side view of an example embodiment of an electrical circuit 102. The electrical circuit 102 may include a substrate 104. In one embodiment, the electrical circuit 102 includes a diode region 106 that includes a portion of the substrate 104. The diode region 106 may be electrically isolated from other substrate regions 108 and 110. In one embodiment, the other substrate regions 108 and 110 are CMOS device regions, such as a first CMOS device region 108 and a second CMOS device region 110. The diode region 106 may be electrically isolated from the other substrate regions 108 and 110 by one or more shallow trench isolation (STI) layers 111. In some embodiments, the STI layers 111 may be from 100-200 nm deep. Additionally, the diode region 106 may be masked during the formation of the STI layers 111.

The electrical circuit 102 may include a first doped layer 112 above the substrate 104 in the diode region 106. In one embodiment, the first doped layer 112 includes in-situ boron doped silicon germanium. The electrical circuit 102 may also include a second doped layer 114 above the first doped layer 112 in the diode region 106. In one embodiment, the second doped layer 114 includes in-situ phosphorus doped silicon and/or a combination of silicon and carbon. The first doped layer 112 and the second doped layer 114 may each be epitaxial layers having a single respective crystal oriented by an orientation of the substrate 104. In some embodiments the epitaxial layers may be a single respective crystal without defect.

Epitaxial growth occurs on a top surface of the substrate 104. When the chemical reactants are controlled and the system parameters set correctly, the depositing atoms arrive at the top surface of the substrate 104 with sufficient energy to move around on the surface and orient themselves to the crystal arrangement of the atoms of the deposition surface. For example, an epitaxial film deposited on a [100] crystal surface (cut along the [100] plane) will take on a [100] orientation. If, on the other hand, the wafer has an amorphous surface layer, the depositing atoms have no surface to align to and form polysilicon instead of single crystal silicon. Silicon sources for the epitaxial growth include silicon tetrachloride, dichlorosilane (SiH2Cl2), and silane (SiH4). The temperature for this epitaxial silicon deposition is from about 550° C. to about 900° C. In one embodiment, the first doped layer 112 and the second doped layer 114 may be formed through epitaxial growth of SiGe on the top surface of the substrate 104. The Ge content of the epitaxial grown SiGe ranges from about 5% to about 60% (by atomic weight). In another embodiment, the Ge content of the epitaxial grown SiGe ranges from about 10% to about 40%.

In-situ doped materials may include materials having the characteristics typical of in-situ doping processes described below. For example, the in-situ doped elements such as boron and phosphorus, may be incorporated into the lattice structure in the deposition process without causing unwanted defects in the lattice structure such as defects caused by ion implantation.

The first doped layer 112 and the second doped layer 114 may be configured together as a diode 116. In one embodiment, the features described directly above are configured as a planar diode. For example, the first doped layer 112 and the second doped layer 114 may be configured together as a vertical PN diode. Embodiments of the vertical PN diode may include a p doped layer above a n doped layer or an n doped layer above a p doped layer.

In one embodiment, the electrical circuit 102 may include one or more CMOS devices in the other substrate regions 108 and 110. In one embodiment, the CMOS devices include a first CMOS device 118 and a second CMOS device 120. The first CMOS device 118 may be in the first CMOS region 108, and the second CMOS device 120 may be in the second CMOS region 110. In one embodiment, the first CMOS device 118 includes a p-channel MOSFET (pFET) above an n doped well 122 in the substrate 104. The second CMOS device 120 may include an n-channel MOSFET (nFET) above a p doped well 124 in the substrate 104. In some embodiments, the substrate in the diode region 106 may also include an n doped well 123. The CMOS devices may each have respective gate structures 125. The gate structures 125 may each include a gate dielectric 127, a gate electrode 129, and spacers 131.

The CMOS devices 118 and 120 may each have a doped source-drain epitaxial layer. The doped source-drain epitaxial layer of one of the CMOS devices 118 and 120 may be of the same material as the first doped layer 112. In one embodiment, the first CMOS device 118 (pFET in this case) includes a p doped source-drain epitaxial layer 126, and the second CMOS device 120 (nFET in this case) includes an n doped source-drain epitaxial layer 128. The p doped source-drain epitaxial layer 126 may be the same material as the first doped layer 112 or the second doped layer 114, and the n doped source-drain epitaxial layer 128 may be the same material as the other of the first doped layer 112 and the second doped layer 114. In one embodiment, the thickness of the p doped source-drain epitaxial layer 126 and/or the n doped source-drain epitaxial layer is less than a thickness of the first doped layer 112.

The width of the diode region 106 may be at least 10 times greater than the pitch of one or more of the CMOS devices 118 and 120. For example, the width of the diode region 106 may be at least 10 times greater than the pitch of one or more of the other substrate regions 108 and 110. Accordingly, the diode region 106 may be at least 10 times greater in pitch than CMOS devices 118 and 120 found in other substrate regions 108 and 110. In some embodiments, the width of the diode region 106 may be at least 100 times greater than the pitch of the one or more of the other substrate regions 108 and 110. In one embodiment, the electric circuit 102 may also include one or more vias 130 in a dielectric layer 132. In some embodiments, the vias 130 may contact one or more silicide layers on the diode 116 and/or CMOS devices 118 and 120.

Figure 2:
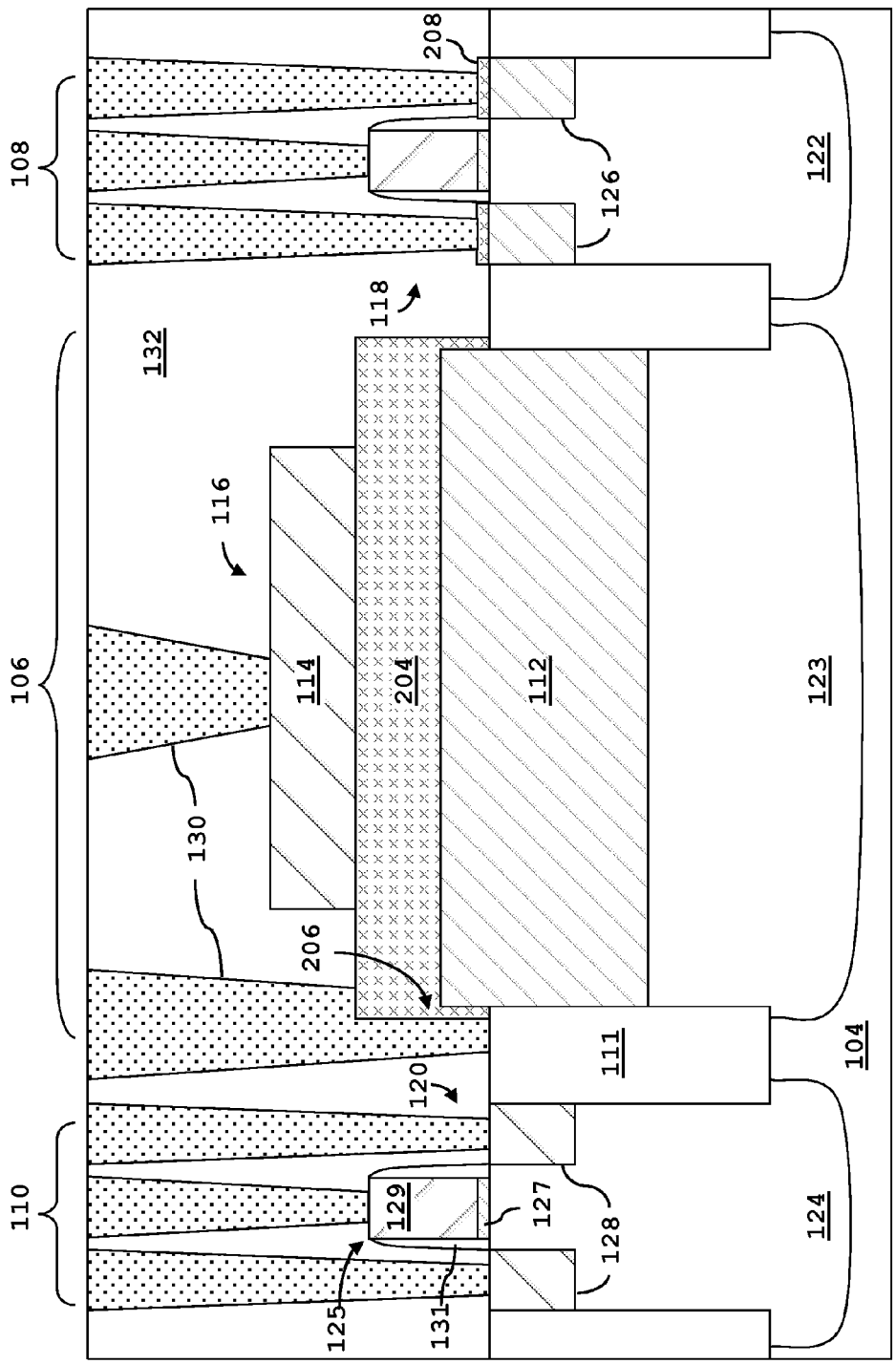
FIG. 2 shows a cross-sectional side view of an example embodiment of another electrical circuit.

FIG. 2 shows a cross-sectional side view of an example embodiment of another electrical circuit 202. The electrical circuit 202 may include some or all of the features of the electrical circuit 102 of FIG. 1. Additionally, the electrical circuit 202 may include a middle undoped layer 204 in the diode region 106 above at least a part of the first doped layer 112. Thus, the second doped layer 114 may be above the middle undoped layer 204, and the middle undoped layer 204 may be another epitaxial layer having a single respective crystal oriented by an orientation of the substrate. The middle undoped layer may be made of silicon or silicon germanium. In one embodiment, the first doped layer 112, middle undoped layer 204, and second doped layer 114 together form a planar diode 116. For example, the first doped layer 112, the middle undoped layer 204 and the second doped layer 114 may be configured together as a vertical PIN diode. In some embodiments, a portion of the middle undoped layer may include a silicide area 206. One of the CMOS devices 118 and 120 may further include an undoped CMOS device layer 208. For example, if the first CMOS device 118 is a pFET, then the first CMOS device 118 may include an undoped CMOS device layer 208 above the p doped source-drain epitaxial layer 126. The undoped CMOS device layer 208 may be made of the same material as the middle undoped layer 204. In one embodiment, the undoped CMOS device layer 208 may include a silicide area.

Figure 3:
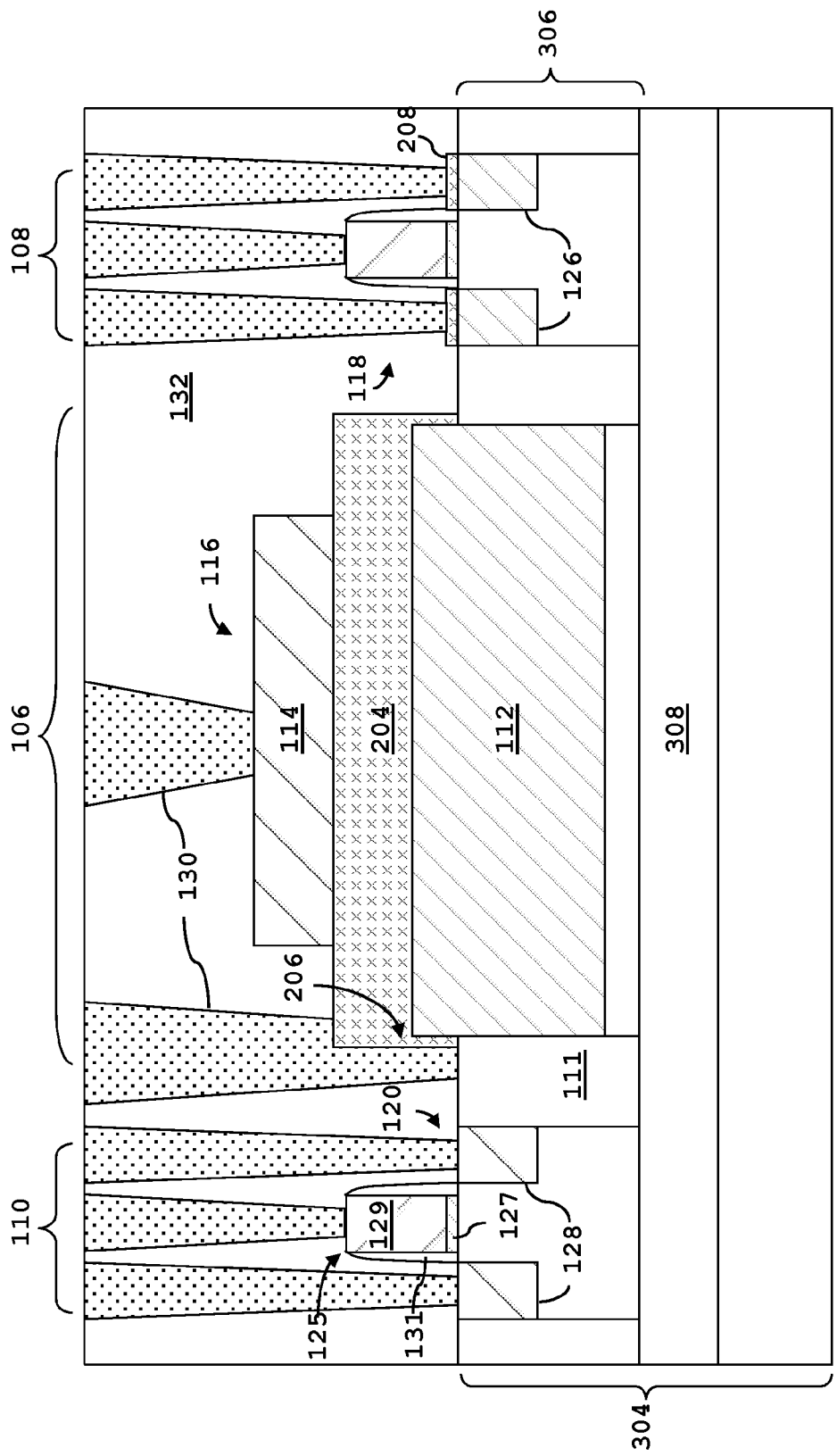
FIG. 3 shows a cross-sectional side view of an example embodiment of an electrical circuit on an SOI substrate.
Figure 4:
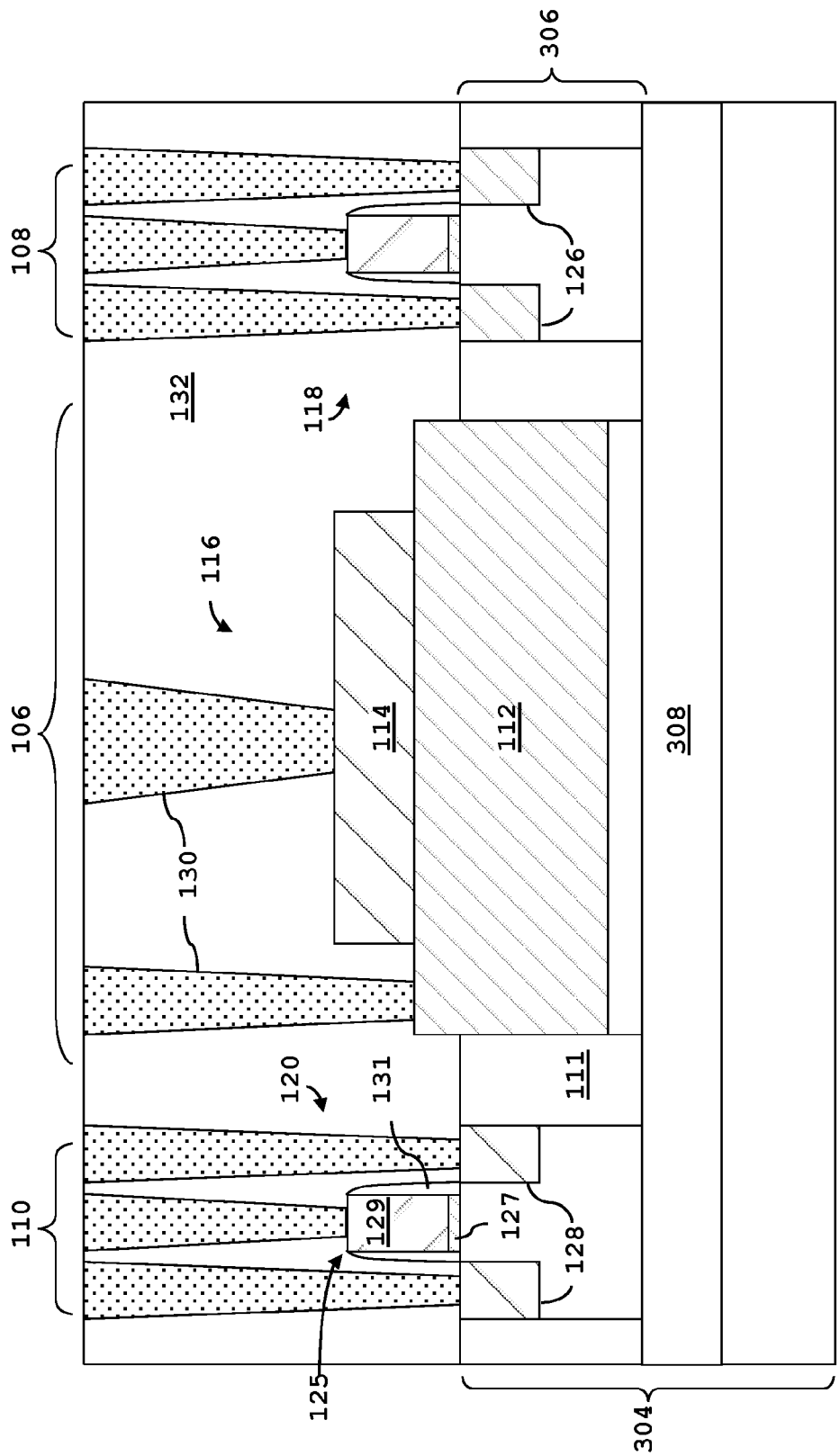
FIG. 4 shows a cross-sectional side view of an embodiment of an electrical circuit similar to the electrical circuit of FIG. 3 but without a middle undoped layer.

FIG. 3 shows a cross-sectional side view of an example embodiment of another electrical circuit 302. The electrical circuit 302 may include some or all of the features of the above circuits 102 and 202. Additionally, the substrate 304 may be a silicon on insulator wafer having a silicon layer 306 above an insulator layer 308. In one embodiment, the silicon layer 306 is at least 40 nm thick. FIG. 4 shows a cross-sectional side view of an embodiment of an electrical circuit 402 similar to the electrical circuit 302 of FIG. 3 but without a middle undoped layer 204. Additionally, the electrical circuits and diodes described above may include some or all of the features described in the methods and fabrication steps below. Likewise, the methods and fabrication steps below may include some or all of the features described in the electrical circuits and diodes above.

Figure 5:
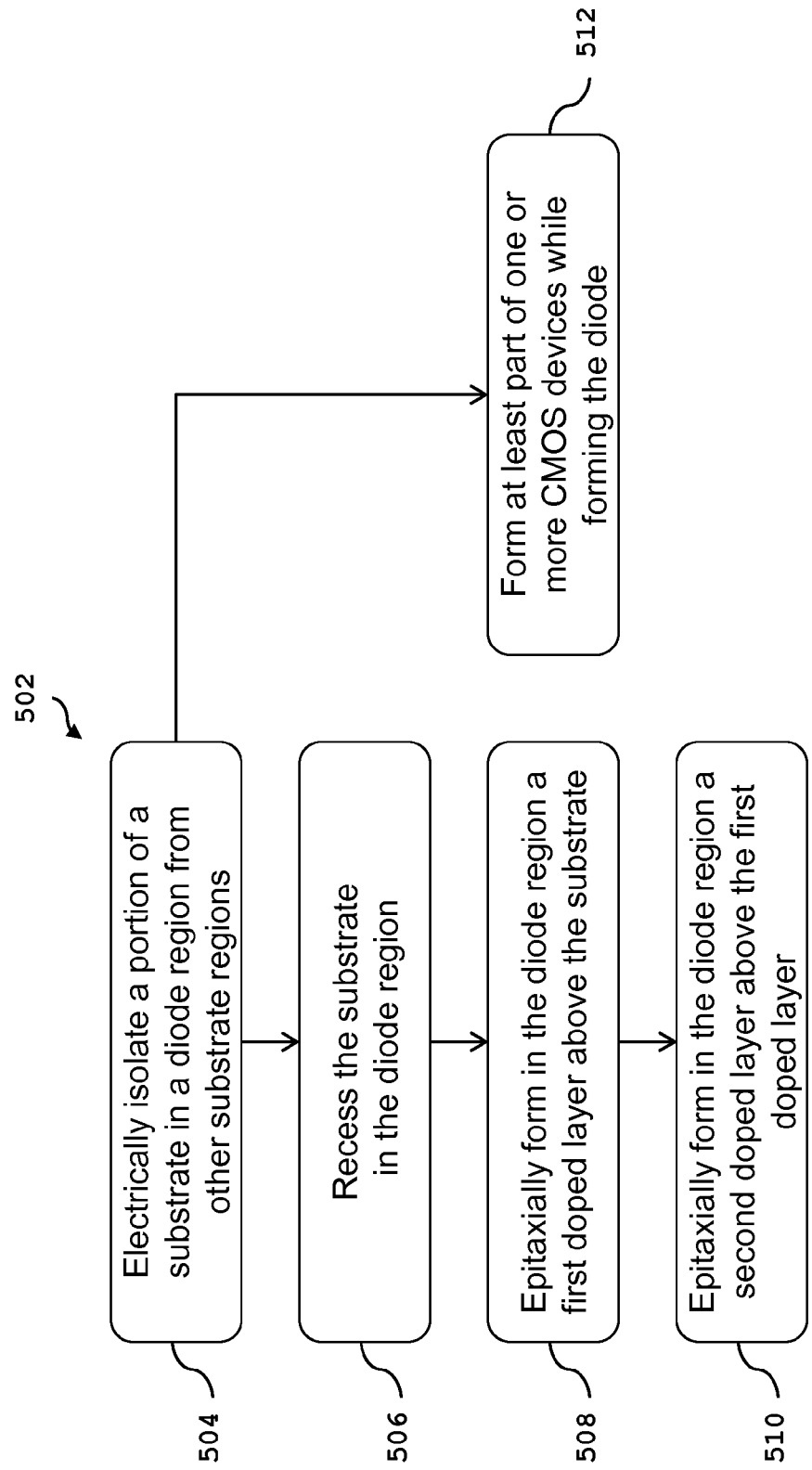
FIG. 5 shows a flow chart of an example embodiment of a method of forming a diode and one or more CMOS devices on the same chip.

FIG. 5 shows a flow chart of an example embodiment of a method 502 of forming a diode and one or more CMOS devices on the same chip. The method 502 may include an isolation step 504 of electrically isolating a portion of a substrate in a diode region from other substrate regions. In one embodiment, the method 502 includes a recessing step 506 of recessing the substrate in the diode region. The method 502 may include a first doped layer forming step 508 of epitaxially forming in the diode region a first doped layer above the substrate. For example, the first doped layer may include in-situ boron doped silicon germanium. The method 502 may also include a second doped layer forming step 510 of epitaxially forming in the diode region a second doped layer above the first doped layer. For example, the second doped layer may include in-situ phosphorus doped silicon and/or a combination of silicon and carbon. In some embodiments, epitaxial formation includes an atomic layer deposition. The epitaxial formation may include a cyclic epitaxy process involving multiple cycles of epitaxial formation each followed by an etch step. The deposition may include in-situ doping process such as the addition of one or more gases in order form an extra element in the lattice of the epitaxially formed layer. In one embodiment, the first doped layer and the second doped layer are configured together as a vertical PN diode. It is noted that in some embodiments, the substrate is a silicon on insulator wafer having a silicon layer above an insulator layer. The silicon layer may be at least 40 nm thick. For example, the substrate may be of a size suitable for conventional PDSOI devices.

In one embodiment, the method 502 includes a CMOS device forming step 512 of forming at least a part of the one or more CMOS devices while forming the diode. For example, the CMOS device forming step 512 may be performed such that recessing the substrate in the diode region includes simultaneously recessing one or more of the other substrate regions. The one or more other substrate regions may be recessed to a lesser extent than occurs in recessing the substrate in the diode region. In one embodiment, the CMOS device forming step 512 is performed such that epitaxially forming the first doped layer and/or epitaxially forming the second doped layer includes simultaneously epitaxially forming an external layer outside the diode region as part of one or more CMOS devices. For example, the one or more CMOS devices may include an nFET and/or pFET, and the external layer may be a source-drain epitaxial layer of the nFET or pFET. Thus, in some embodiments of the method 502, the CMOS device forming step 512 may be performed simultaneous to other steps than the first doped layer forming step 508 as depicted in Fig. For example, the CMOS device forming step 512 may be performed simultaneous to the second doped layer forming step 510. In one embodiment, the CMOS device forming step 512 is performed simultaneous to more than one step of the method 502. Additionally, in one embodiment, the width of the diode region is at least 10 times greater than a pitch of the one or more CMOS devices.

Figure 6:
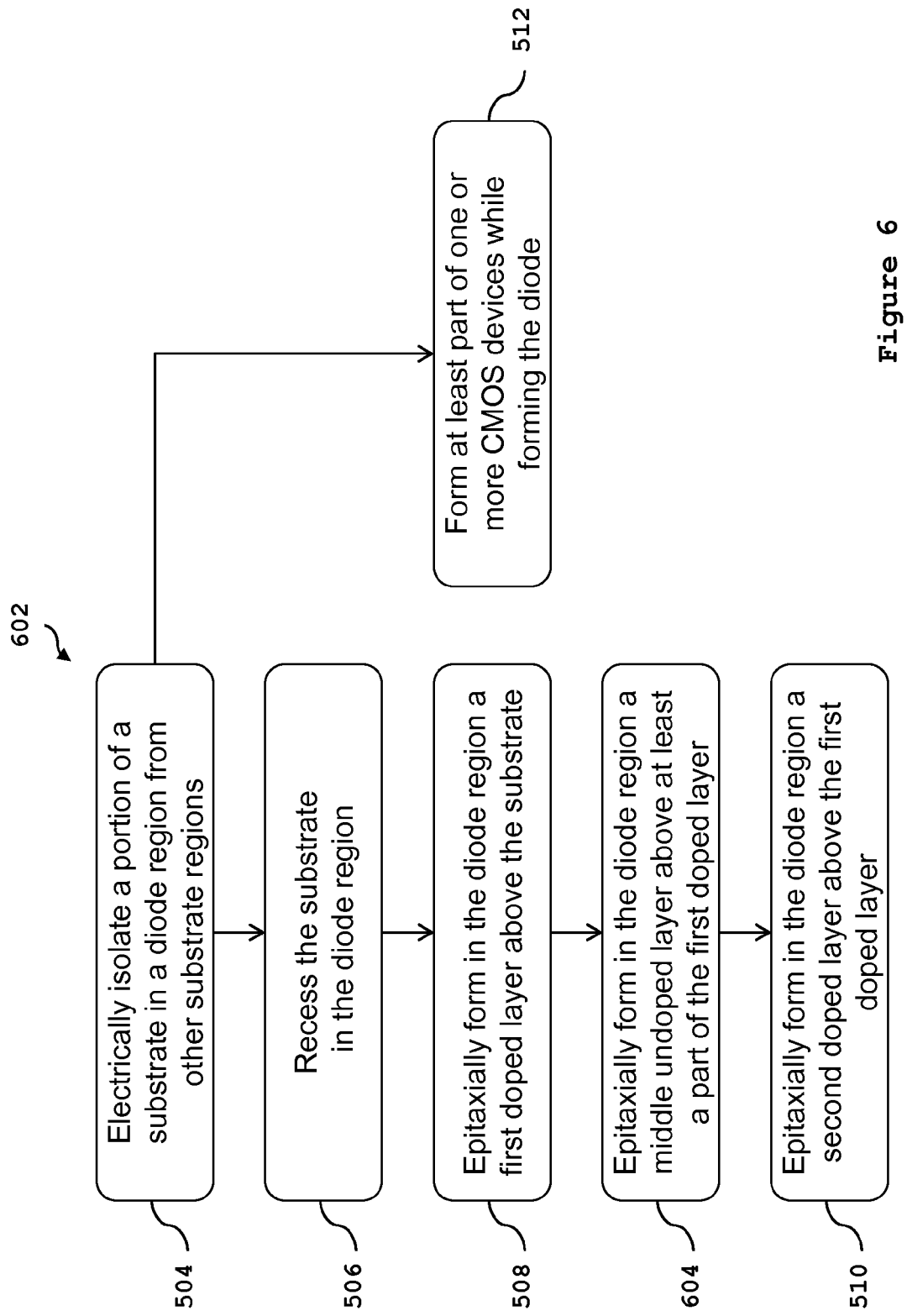
FIG. 6 shows a flow chart of an example embodiment of another method of forming a diode and one or more CMOS devices on the same chip.

FIG. 6 shows a flow chart of an example embodiment of another method 602 of forming a diode and one or more CMOS devices on the same chip. The method 602 may include some or all of the steps and features of the method 502 of FIG. 5. Additionally, the method 602 may include a middle undoped layer forming step 604 of epitaxially forming in the diode region a middle undoped layer above at least a part of the first doped layer. In one embodiment, the CMOS device forming step 512 is performed simultaneous to the middle undoped layer forming step 604. In one embodiment, the second doped layer is formed above the middle undoped layer. For example, the first doped layer, the middle undoped layer and the second doped layer may be configured together as a vertical PIN diode.

Example embodiments of the methods of FIG. 5 and FIG. 6 are illustrated in further detail through the following figures and accompanying description. FIGS. 7-14 show example steps in forming an embodiment of an electrical circuit and diode, and FIGS. 15-28 show example steps in forming another embodiment of an electrical circuit.

Figure 7:
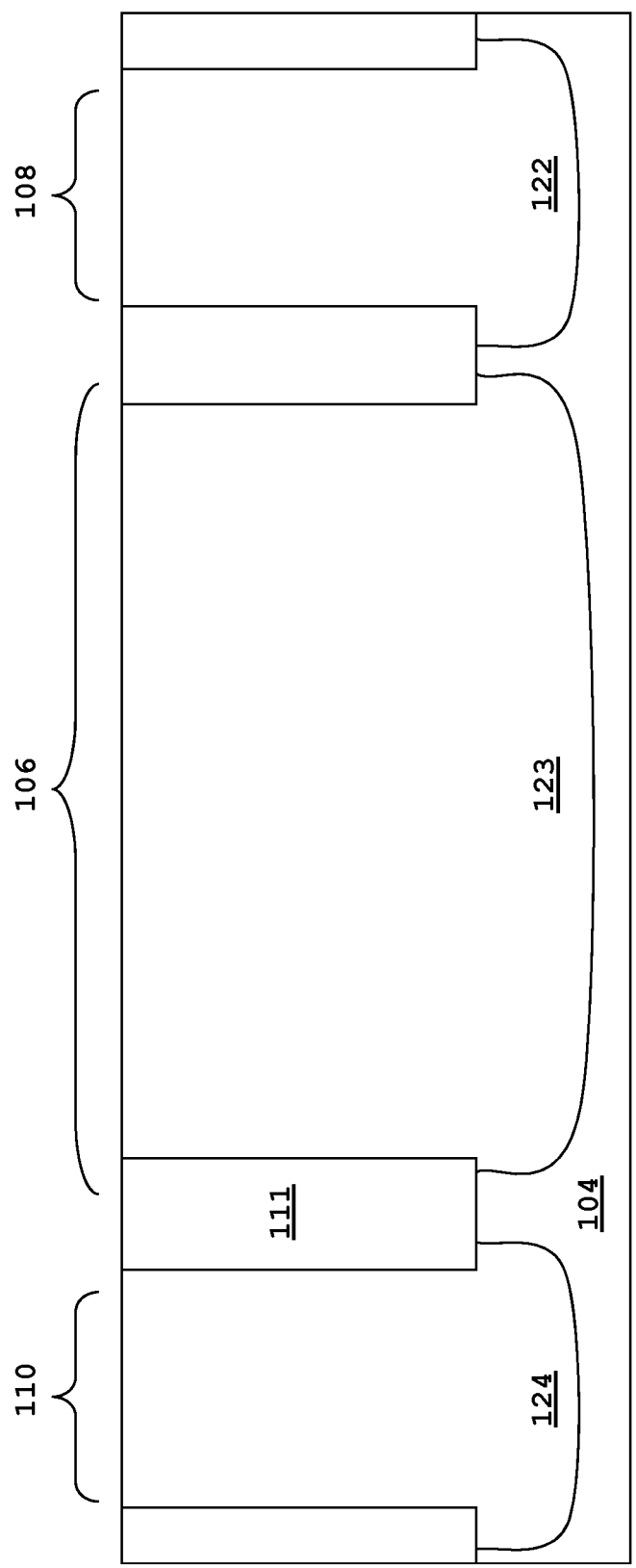
FIG. 7 shows a cross-sectional side view of the formation of shallow trench isolation layers in a substrate.

FIG. 7 shows a cross-sectional side view of the formation of shallow trench isolation (STI) layers 111 in a substrate 104. Though only one form is shown in FIG. 7, the substrate may be a semiconductor substrate in either bulk form or a semiconductor on insulator (SOI) wafer. The semiconductor substrate material may be silicon. In the case of an SOI substrate 304, the STI layers 111 may extend down to an insulator layer 308, as shown in FIG. 3. The STI layers 111 may be used to define regions in the substrate 104 for the formation of a diode and one or more CMOS devices. Embodiments of the invention are illustrated through an electrical circuit with two CMOS devices, but other embodiments of the invention may include a different number of CMOS devices. After the STI layers 111 are formed, a p doped well 124 may be formed in a second CMOS device region 110 of the substrate 104, and an n doped well 122 may be formed in a first CMOS device region 108 of the substrate 104. The p doped well 124 and n doped well 122 may be formed by ion implantation and annealing processes. In one embodiment, another n doped well 122 is similarly formed in the diode region 106, but some embodiments may not include an n doped well 122 in the diode region 106.

Figure 8:
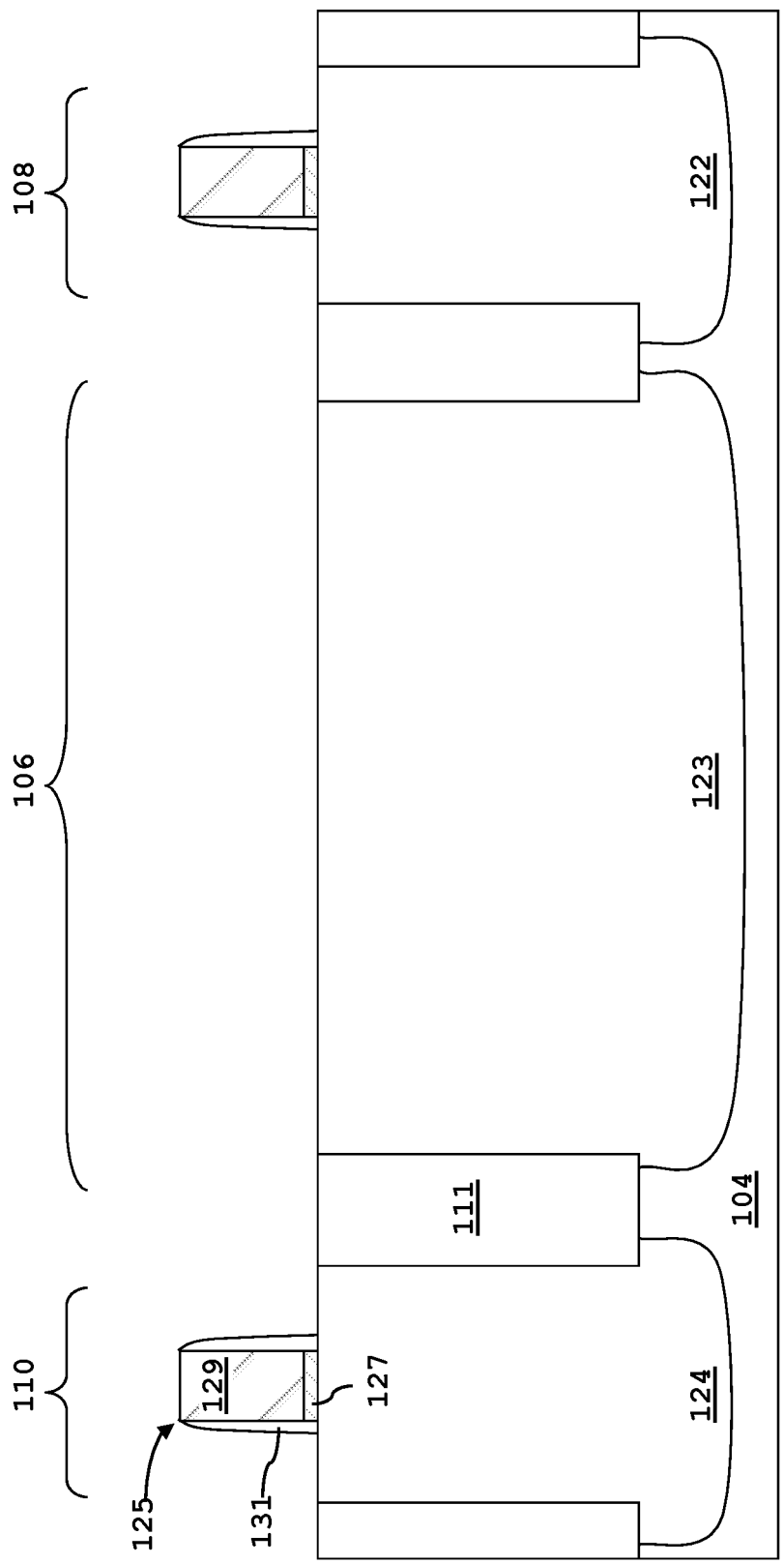
FIG. 8 shows a cross-sectional side view of the formation of one or more gate structures.

FIG. 8 shows a cross-sectional side view of the formation of one or more gate structures 125. A first gate structure may be formed in first CMOS device region, and a second gate structure may be formed in the second CMOS device region. The gate structures 125 may, for example, be formed by a gate first or a dummy gate for gate last process. Each gate structure 125 may include a gate dielectric 127, gate electrode 129, and, in some embodiments, a gate hard mask. Spacers 131 may also be formed on the sides of the gate structures 125.

Figure 9:
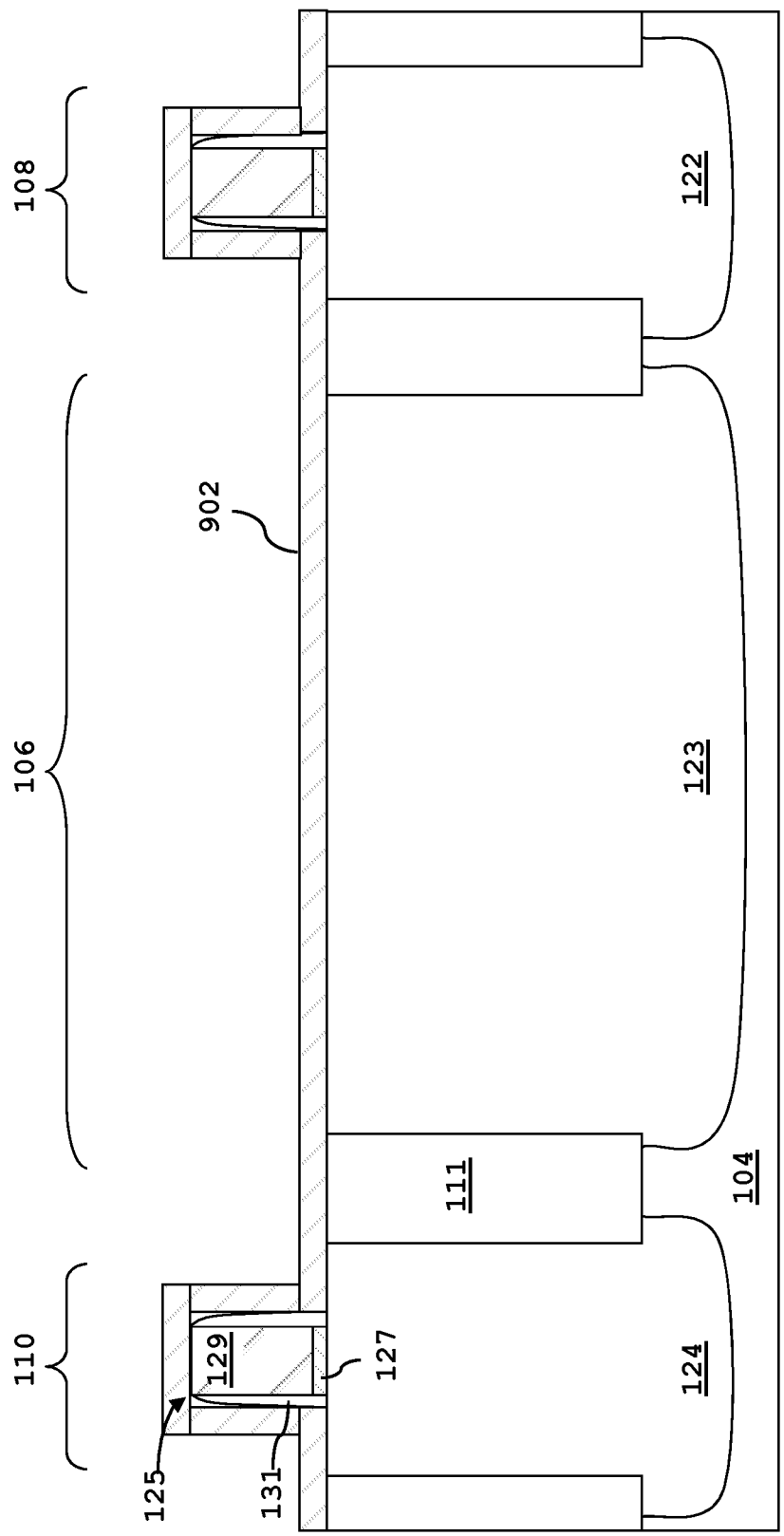
FIG. 9 shows a cross-sectional side view of the deposition of a first hard mask on top of the substrate, STI layers and gate structures.

FIG. 9 shows a cross-sectional side view of the deposition of a first hard mask 902 on top of the substrate 104, STI layers 111 and gate structures 125. An example hard mask material includes silicon nitride.

Figure 10:
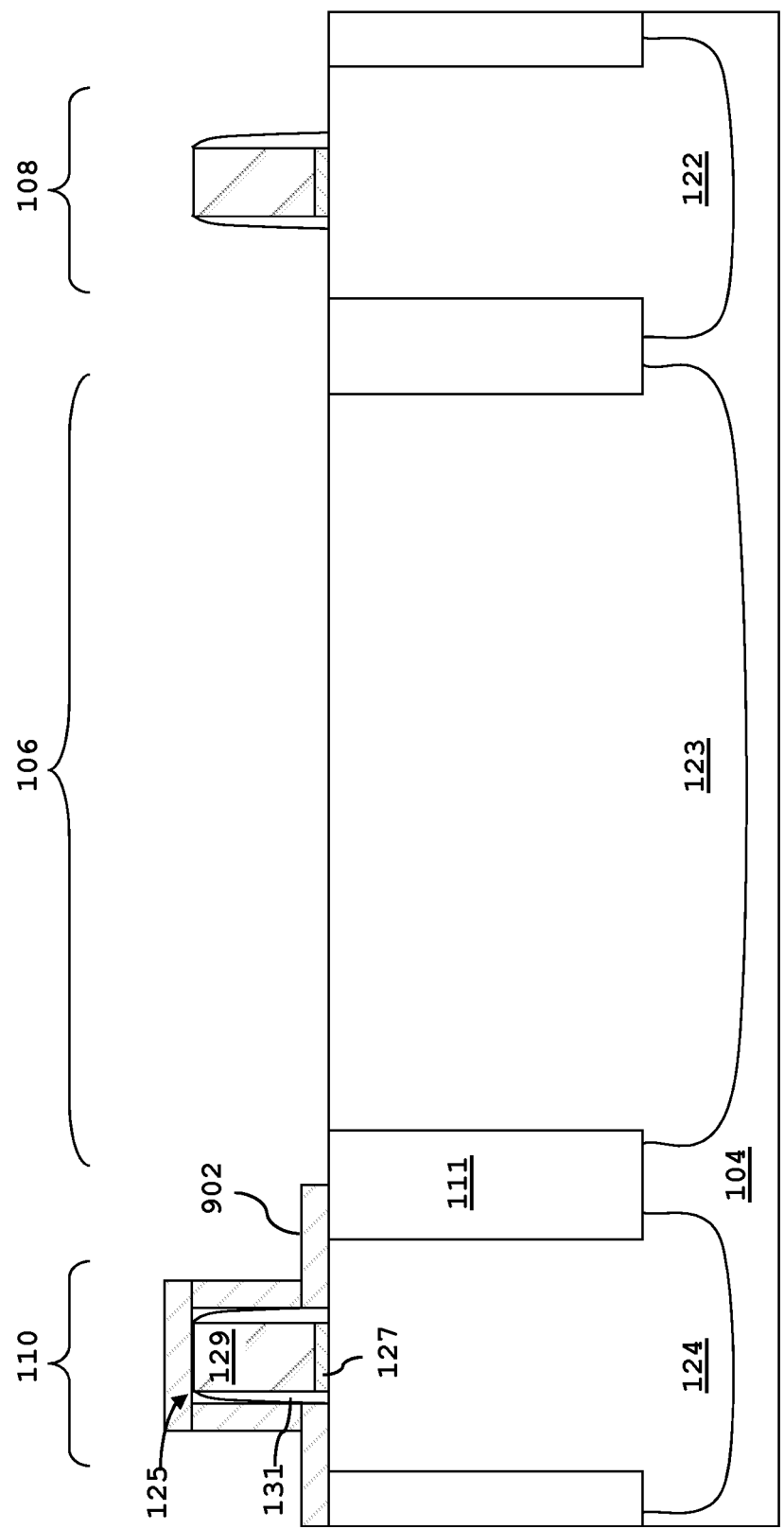
FIG. 10 shows a cross-sectional side view of patterning of the first hard mask.

FIG. 10 shows a cross-sectional side view of patterning of the first hard mask 902. For example, patterning may be performed by applying a photo resist and lithography. The first hard mask 902 may be removed from the diode region 106 and from one of the CMOS regions 108 and 110. In one embodiment, the first hard mask 902 is removed from the diode region 106 and first CMOS device region 108. Removal of the first hard mask 902 may be performed, for example, by a reactive ion etch. The first hard mask 902 may remain in one or more of the other CMOS device regions 108 and 110, such as the second CMOS device region 110.

Figure 11:
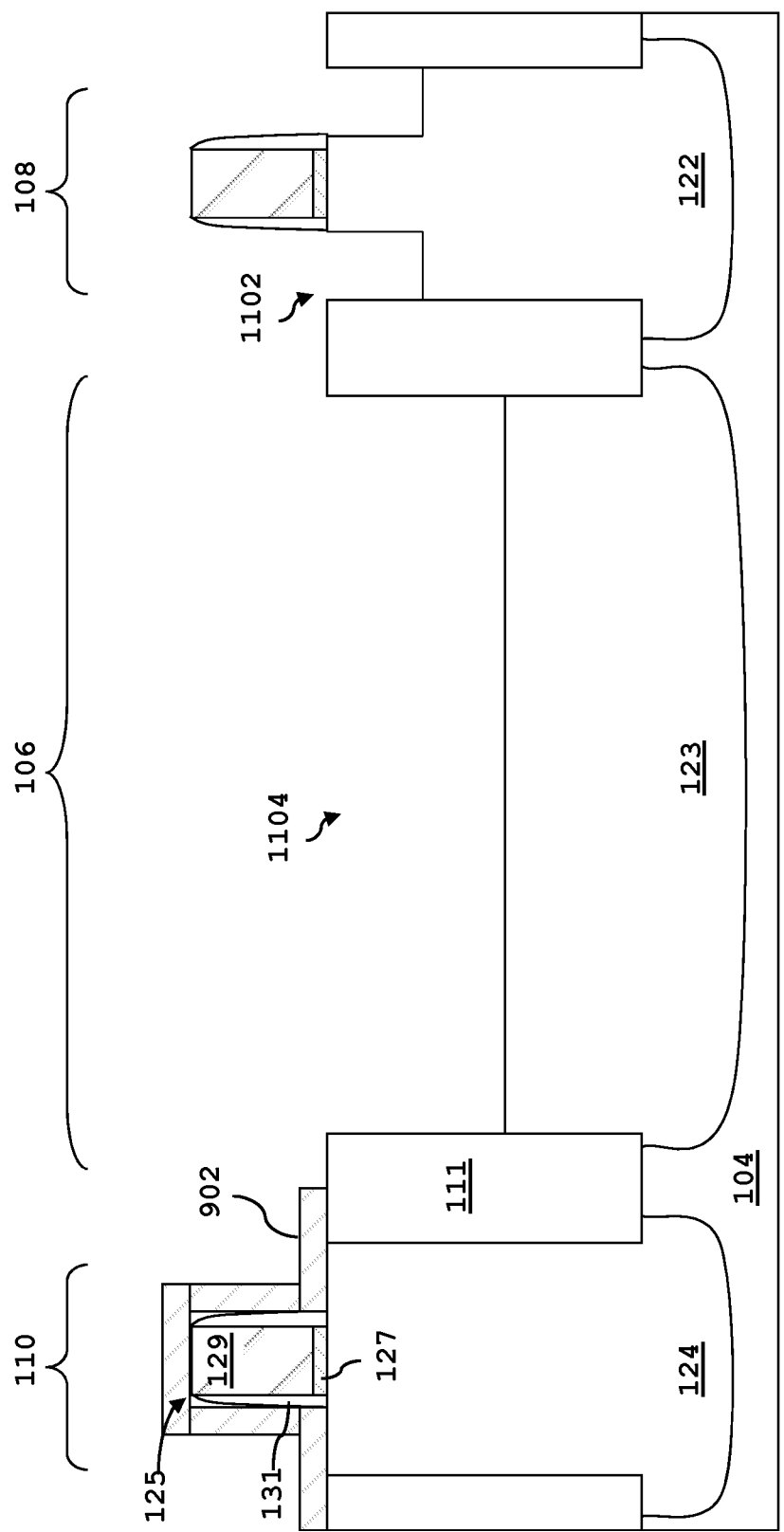
FIG. 11 shows a cross-sectional side view of one or more substrate regions being recessed.

FIG. 11 shows a cross-sectional side view of one or more substrate regions being recessed. In one embodiment, the diode region 106 and one or more CMOS device regions 108 and 110 are recessed. For example, the substrate of the first CMOS region 108 may be recessed, forming a first CMOS recessed area 1102. Additionally, the substrate of the diode region 106 may be recessed to form a recessed diode area 1104. In one embodiment, the substrate of the diode region 106 is recessed to a greater depth than the substrate of the CMOS device region 108.

Figure 12:
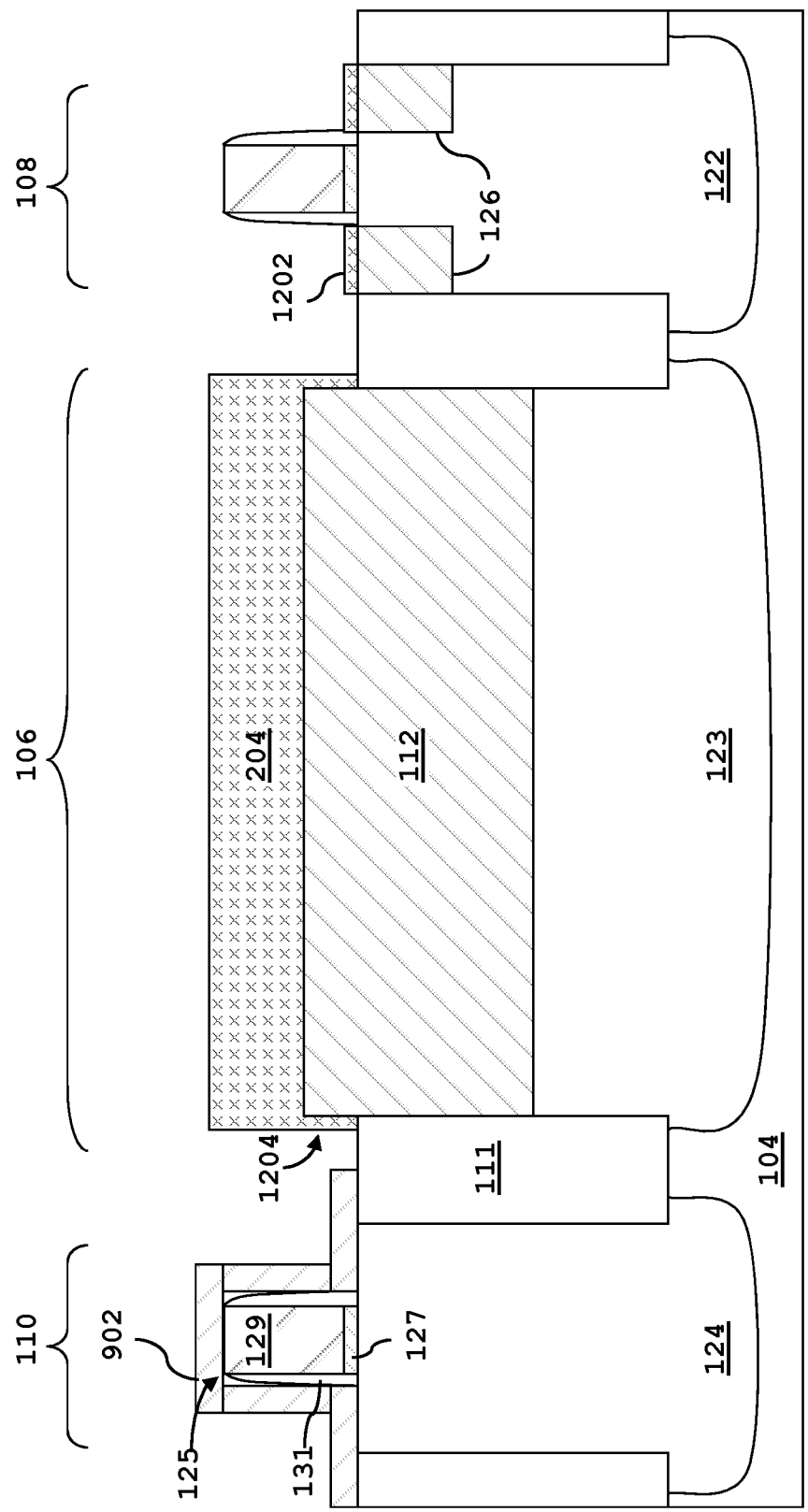
FIG. 12 shows a cross-sectional side view of the formation of a first doped layer and a middle undoped layer.

FIG. 12 shows a cross-sectional side view of the formation of a first doped layer 112 and a middle undoped layer 204. The first doped layer may be formed in the first recessed diode area 1104 of the diode region 108. Additionally, a first source-drain epitaxial layer may be formed in one or more CMOS device regions. For example, a p doped source-drain epitaxial layer 126 may be formed in the first CMOS recessed area 1102 of the first CMOS device region 108. The first doped layer 112 and the first source-drain epitaxial layer 126 may be formed simultaneously, for example, by an epitaxial formation process, such as atomic layer deposition. In one embodiment, the first doped layer and first source-drain epitaxial layer 126 are both formed of the same material, such as heavily doped p+ silicon germanium. In one embodiment, the first doped layer and first source-drain epitaxial layer include in-situ boron doped silicon germanium. In-situ doping may be performed by an atomic layer deposition in which one or more gases are introduced in order to cause the deposition of an extra element, such as boron or phosphorus, into the lattice structure of an epitaxial layer being formed primarily with one or more other elements. The first doped layer 112 in the diode region 108 may be thicker than the first source-drain epitaxial layer 126 in the one or more CMOS regions.

An undoped middle layer 204 may be formed above the first doped layer 112 in the diode region 108. In one embodiment, an undoped CMOS layer 1202 is also formed above the first source-drain epitaxial layer 126 of one or more CMOS devices. In one embodiment, the middle undoped layer 204 and undoped CMOS layer 1202 are formed simultaneously, for example, by an epitaxial process. The middle undoped layer 204 and undoped CMOS layer 1202 may be made of the same material. Two example suitable materials include undoped silicon or silicon germanium. In one embodiment, a portion 1204 of the middle undoped layer 204 is formed on the sidewalls of the first doped layer 112 with a (110) orientation. It should be noted that the first source-drain epitaxial layer 126 may not be at exact level with the substrate surface. Additionally, epitaxial formation may be vertical or faceted.

Figure 13:
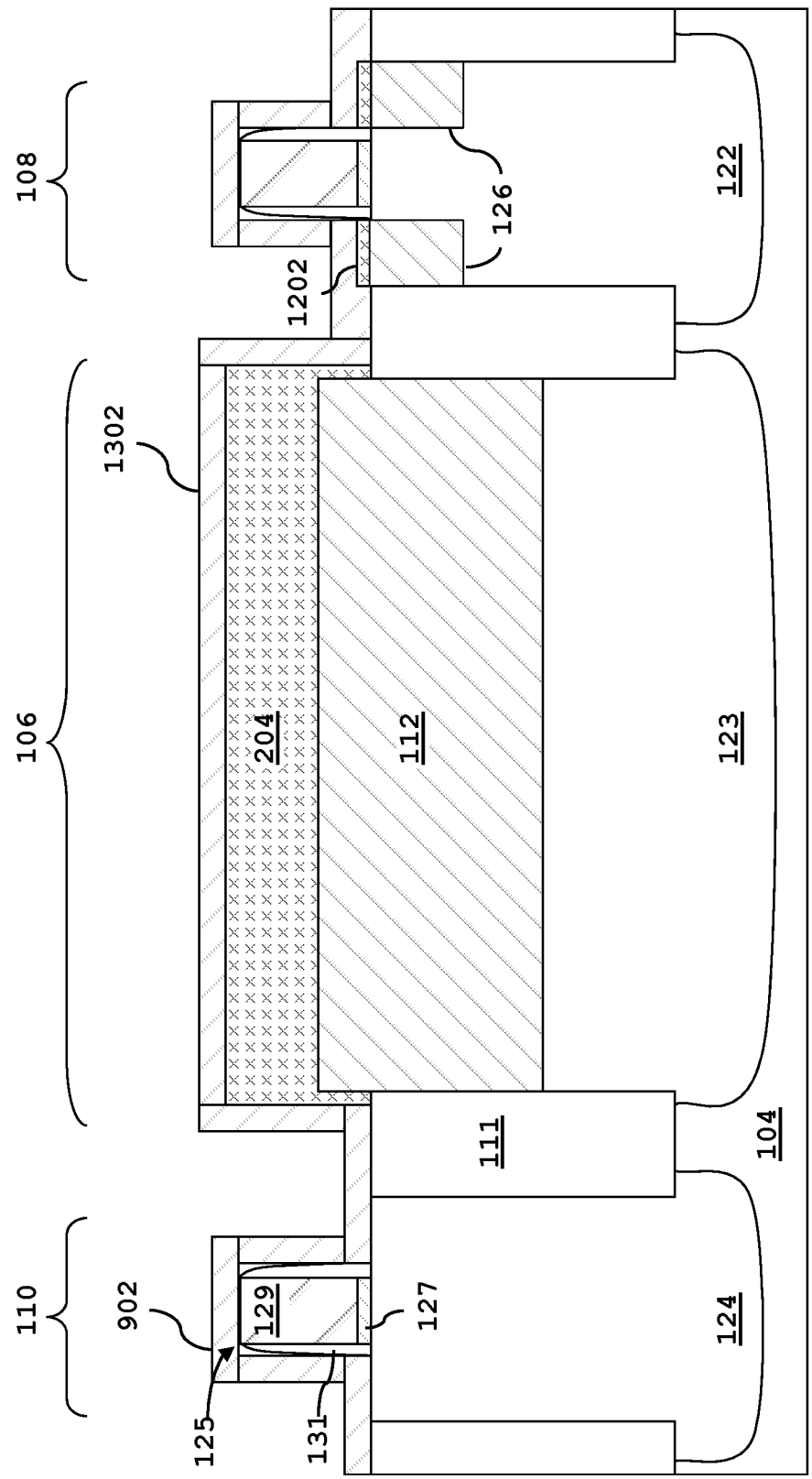
FIG. 13 shows a cross-sectional side view of the formation of a second hard mask.
Figure 14:
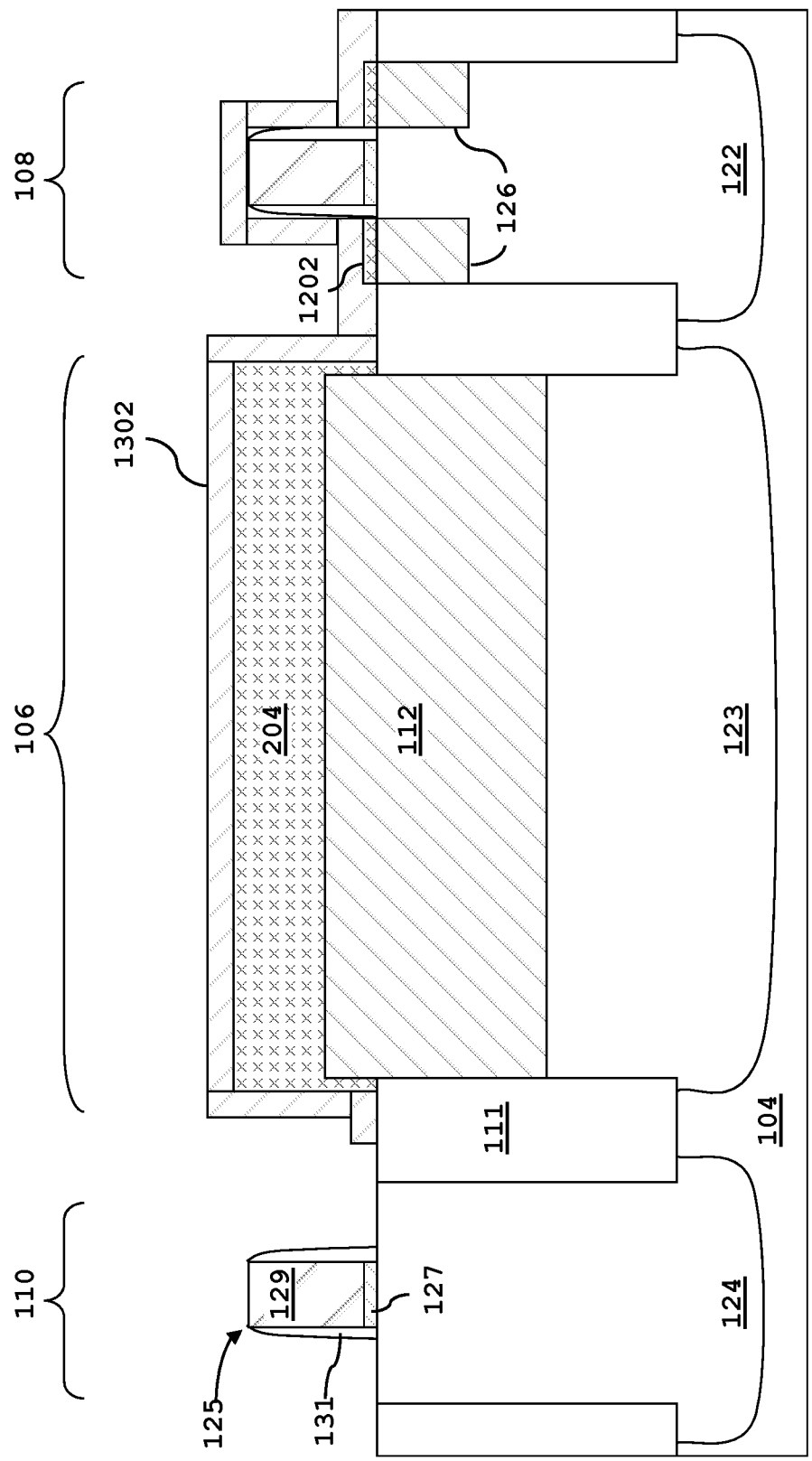
FIG. 14 shows a cross-sectional side view of the removal of the first hard mask from a second CMOS device region.
Figure 15:
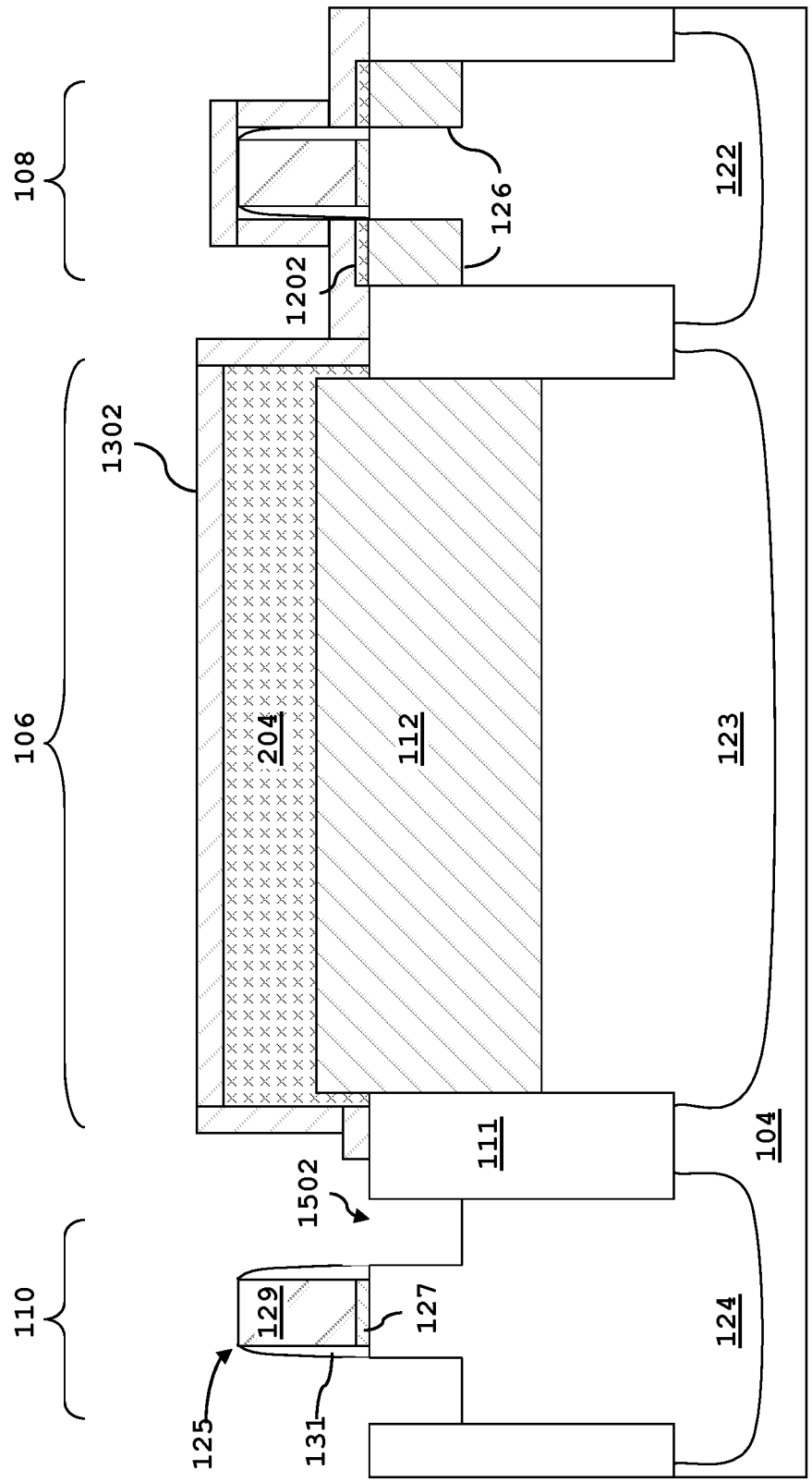
FIG. 15 shows a cross-sectional side view of the recession of a portion of the substrate in the second CMOS device region.
Figure 16:
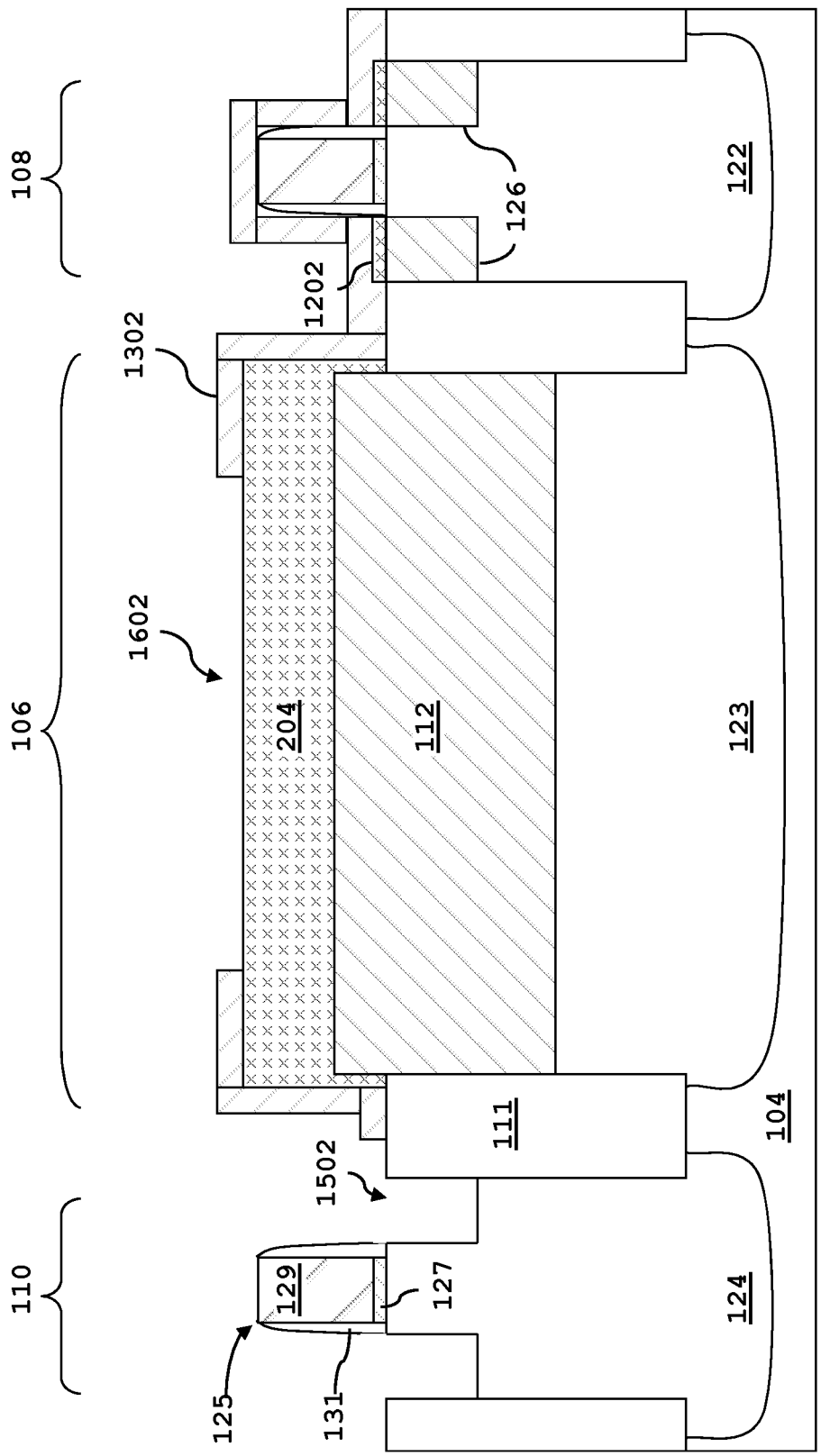
FIG. 16 shows a cross-sectional side view of the removal of the second hard mask in an area of the diode region to form a mask in the diode region.

FIG. 13 shows a cross-sectional side view of the formation of a second hard mask 1302. FIG. 14 shows a cross-sectional side view of the removal of the first hard mask 902 from a second CMOS device region 110. In one embodiment, the second CMOS device region 110 is an nFET region. FIG. 15 shows a cross-sectional side view of the recession of a portion of the substrate in the second CMOS device region 110 to create a second CMOS recessed area 1502. FIG. 16 shows a cross-sectional side view of the removal of the second hard mask 1302 in an area 1602 of the diode region 106 to form a mask in the diode region 108. It is noted that if the middle undoped layer 204 in the diode region 106 is thick enough (the recess depth of the second CMOS device plus the desired final thickness of the middle undoped layer), instead of forming this mask an opening in the hard mask may be made at the same time the second CMOS device is exposed from the first hard mask 902, as shown in FIG. 14.

Figure 17:
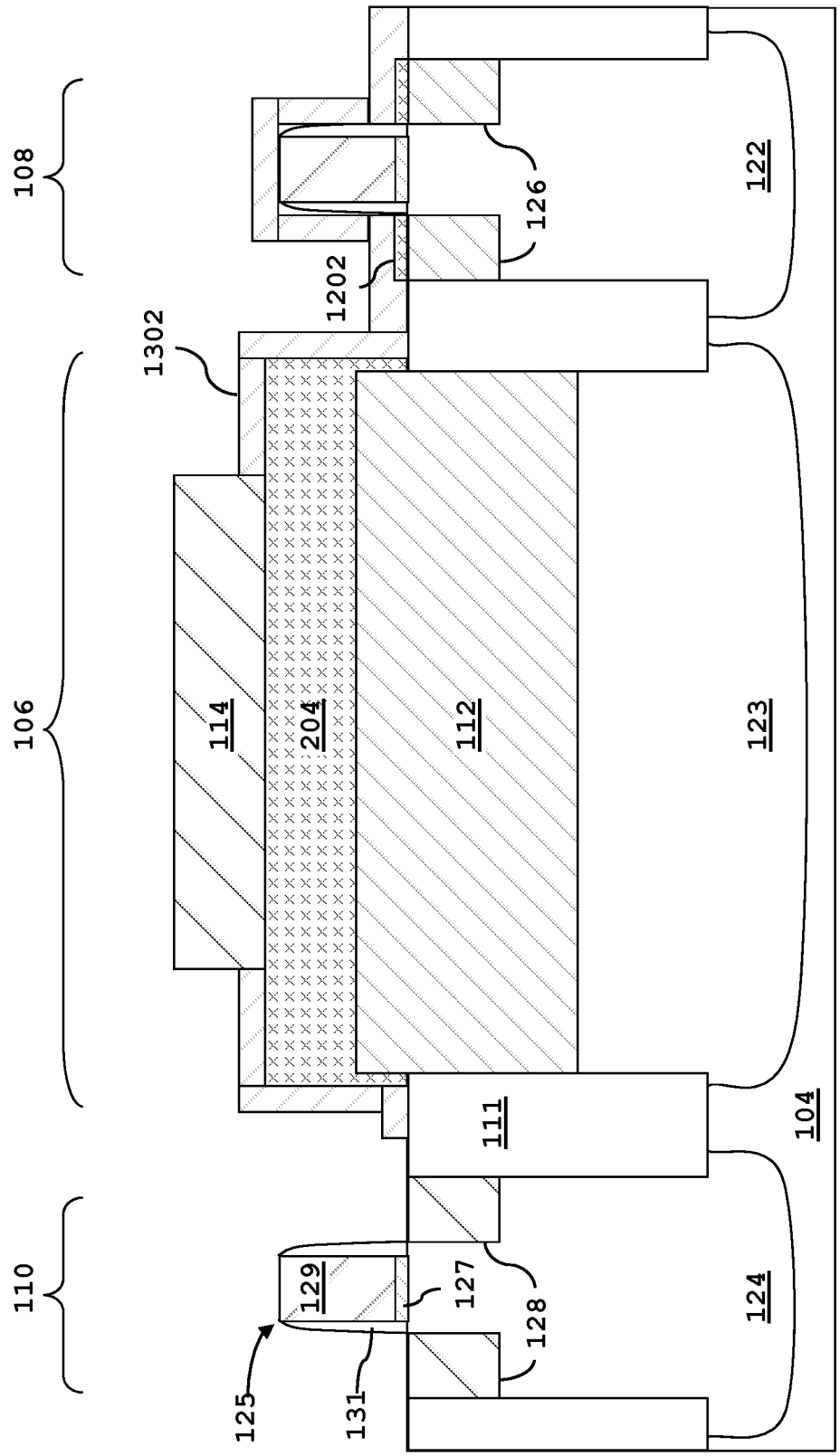
FIG. 17 shows a cross-sectional side view of the formation of the second doped layer in the diode region.

FIG. 17 shows a cross-sectional side view of the formation of the second doped layer 114 in the diode region 106. The second doped layer 114 may be formed in the area 1602 exposed by removal of a portion of the second hard mask 1302 in the diode region 108. In one embodiment, a second source-drain epitaxial layer 128 is formed in the second CMOS recessed area 1502 of the substrate in the second CMOS region 110. For example, an n doped source-drain epitaxial layer 128 may be formed in the second CMOS device region 110. The second doped layer 114 and second source-drain epitaxial layer 128 may be formed simultaneously. For example, the second doped layer 114 and the second source-drain epitaxial layer 128 may be formed by an epitaxial process. The second doped layer 114 and second source-drain epitaxial layer 128 may be formed of the same material. Example materials include heavily doped n+ silicon or a combination of silicon and carbon.

Returning to FIG. 2, the fabrication process is shown completed after finalizing steps. The finalizing steps may include removing the remaining portion of the second hard mask. After the second hard mask is removed, silicide contacts may be formed. Then, vias 130 may be formed in a dielectric layer 132 to form an electric circuit 202 including a planar diode 116, first CMOS device 118, and second CMOS device 120. In one embodiment, shown in FIG. 3, the steps illustrated in FIGS. 7-17 may be performed on a semiconductor on insulator substrate 304. In another embodiment, shown in FIG. 4, the fabrication process illustrated in FIGS. 7-17 may omit one or more steps such that no middle undoped layer is formed.

Figure 18:
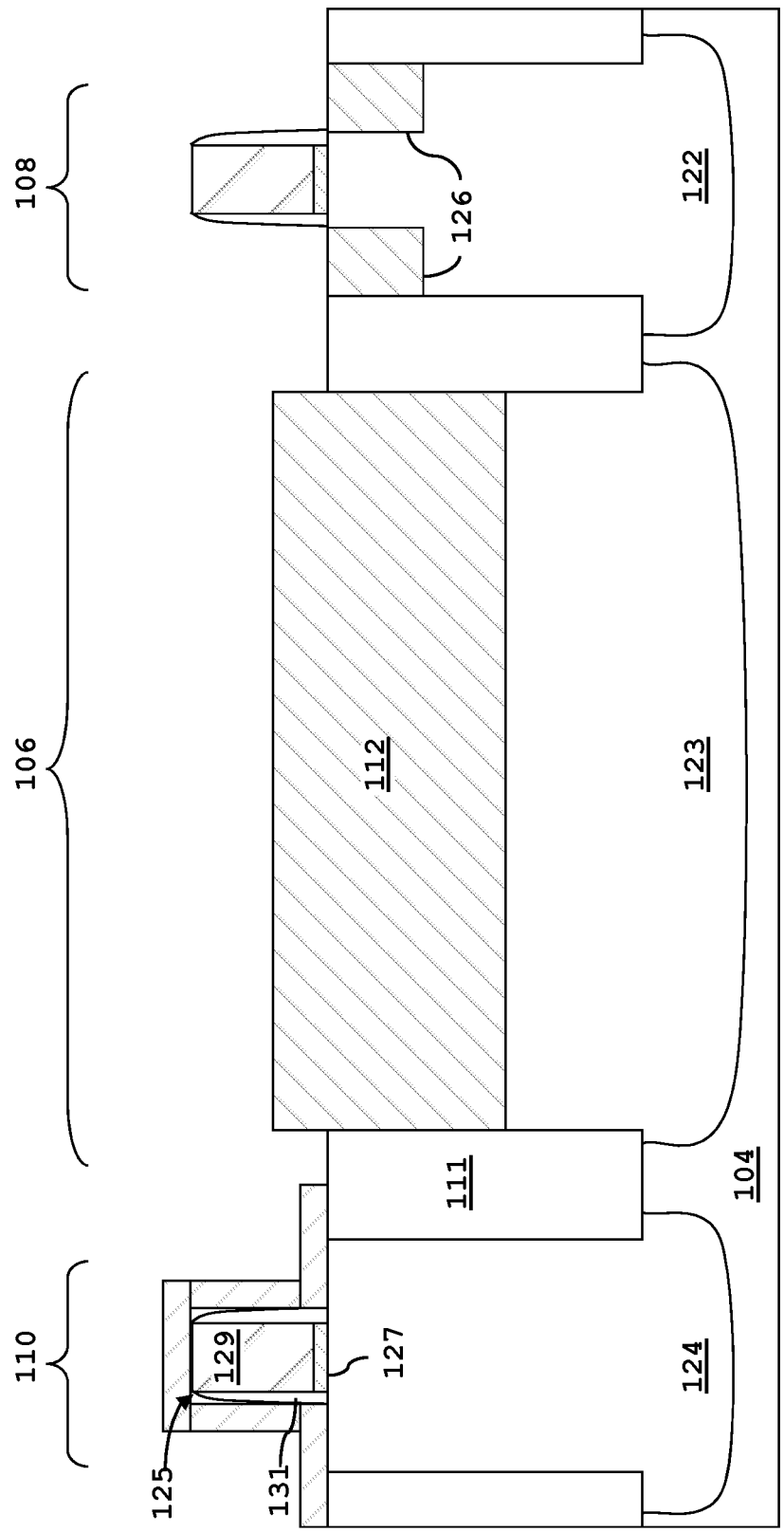
FIG. 18 shows a cross-sectional side view of the formation of a first doped layer.

FIGS. 18-25 show a different embodiment for forming an electrical circuit and planar diode. FIG. 18 shows a step that follows the process shown in FIGS. 7-11.

FIG. 18 shows a cross-sectional side view of the formation of a first doped layer 112. The formation of the first doped layer 112 may follow, for example, the recession of the substrate 104 shown in FIG. 11. A first source-drain epitaxial layer 126 may also be formed in the first CMOS recessed area 1102 of the first CMOS device region 108. In one embodiment, the first source-drain epitaxial layer 126 and the first doped layer 112 are formed from the same material. An example material includes highly doped p+ silicon germanium. In one embodiment, the first doped layer 112 and first source-drain epitaxial layer in the first CMOS device region 108 are simultaneously formed. Simultaneous formation may be accomplished by epitaxial formation.

Figure 19:
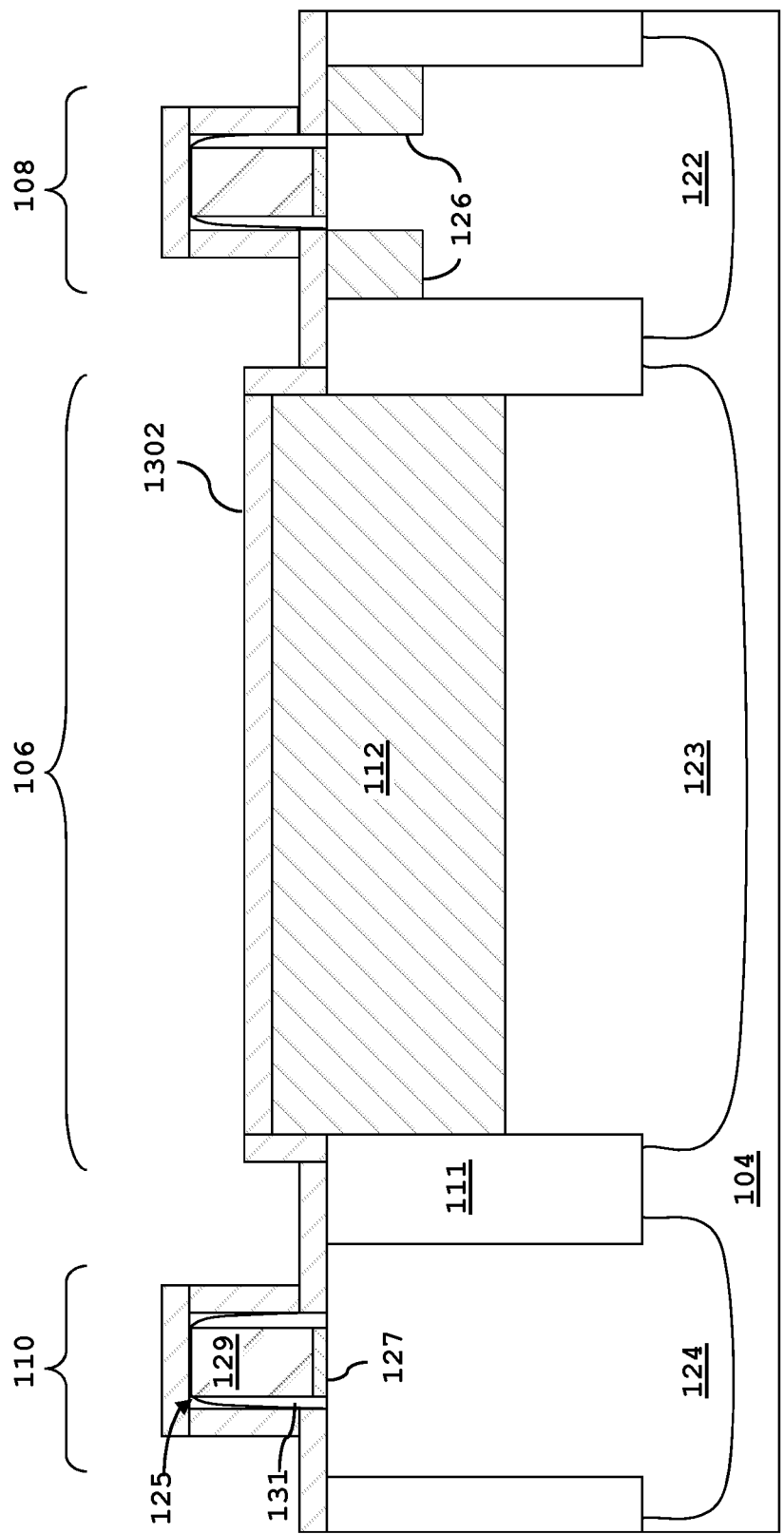
FIG. 19 shows a cross-sectional side view of the formation of a second hard mask on top of the substrate, STI layers, first doped layer, and gate structure.
Figure 20:
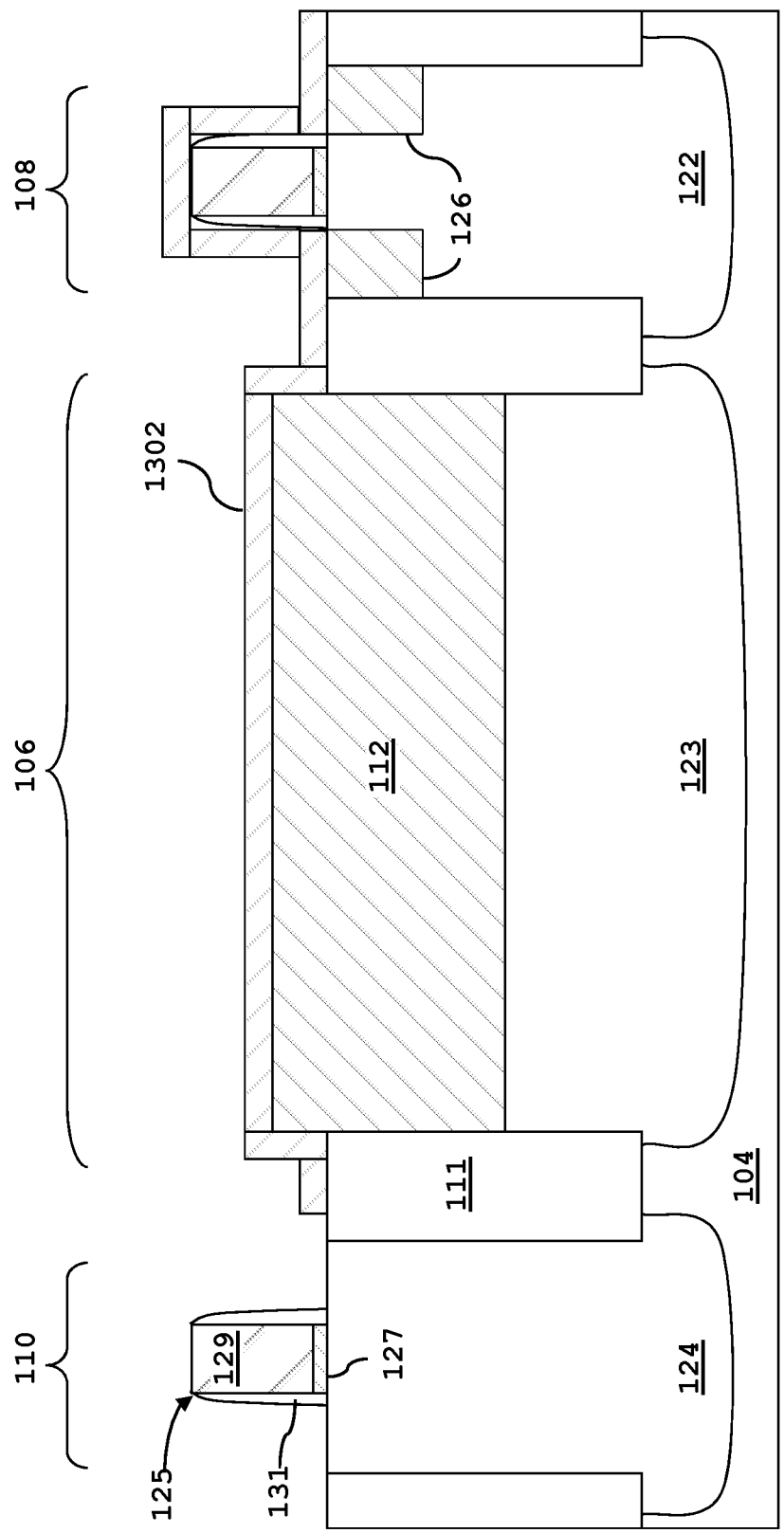
FIG. 20 shows a cross-sectional side view of the removal of the second hard mask from the second CMOS device region.
Figure 21:
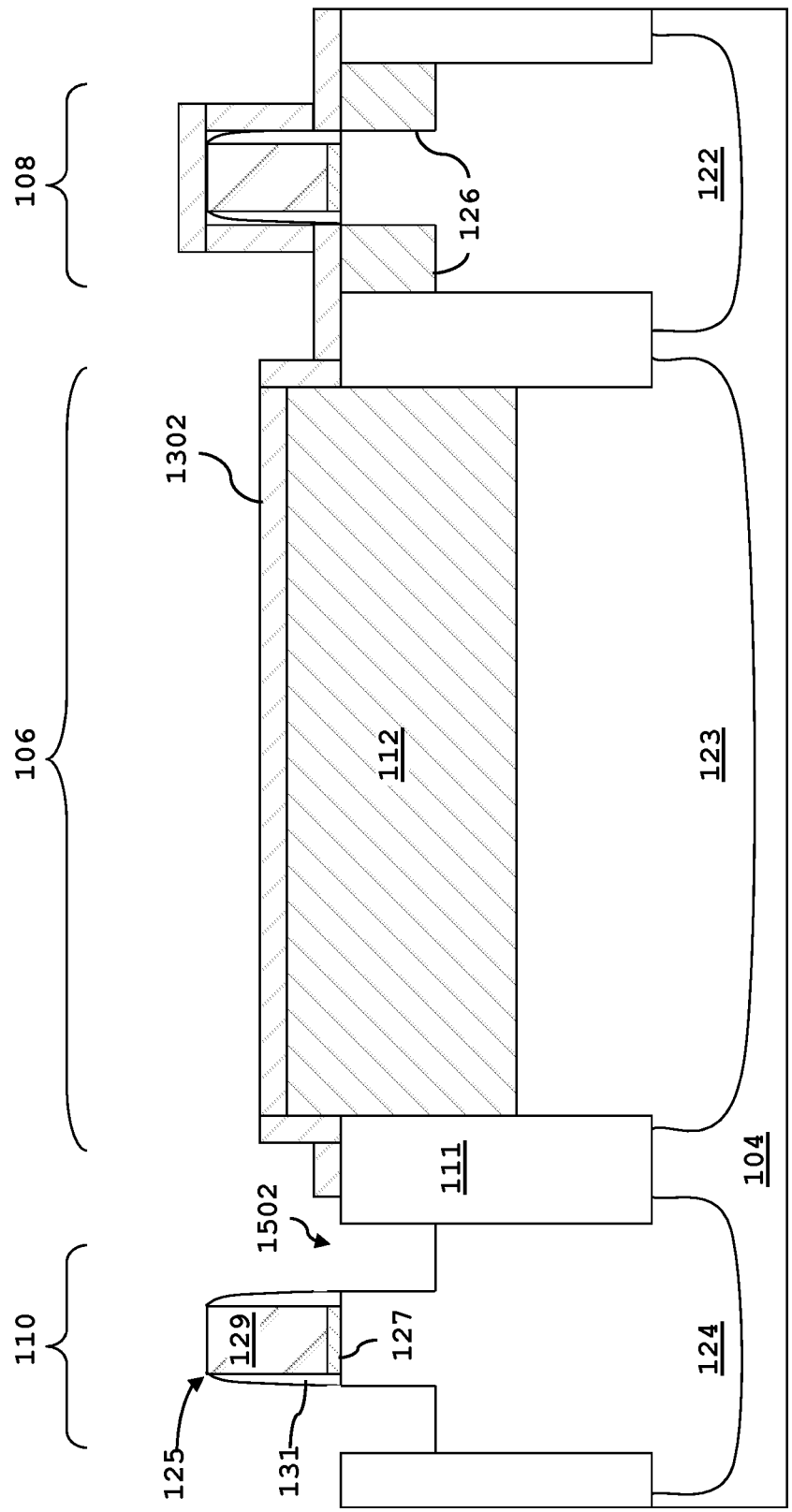
FIG. 21 shows a cross-sectional side view of a portion of the substrate in the second CMOS device region being recessed.
Figure 22:
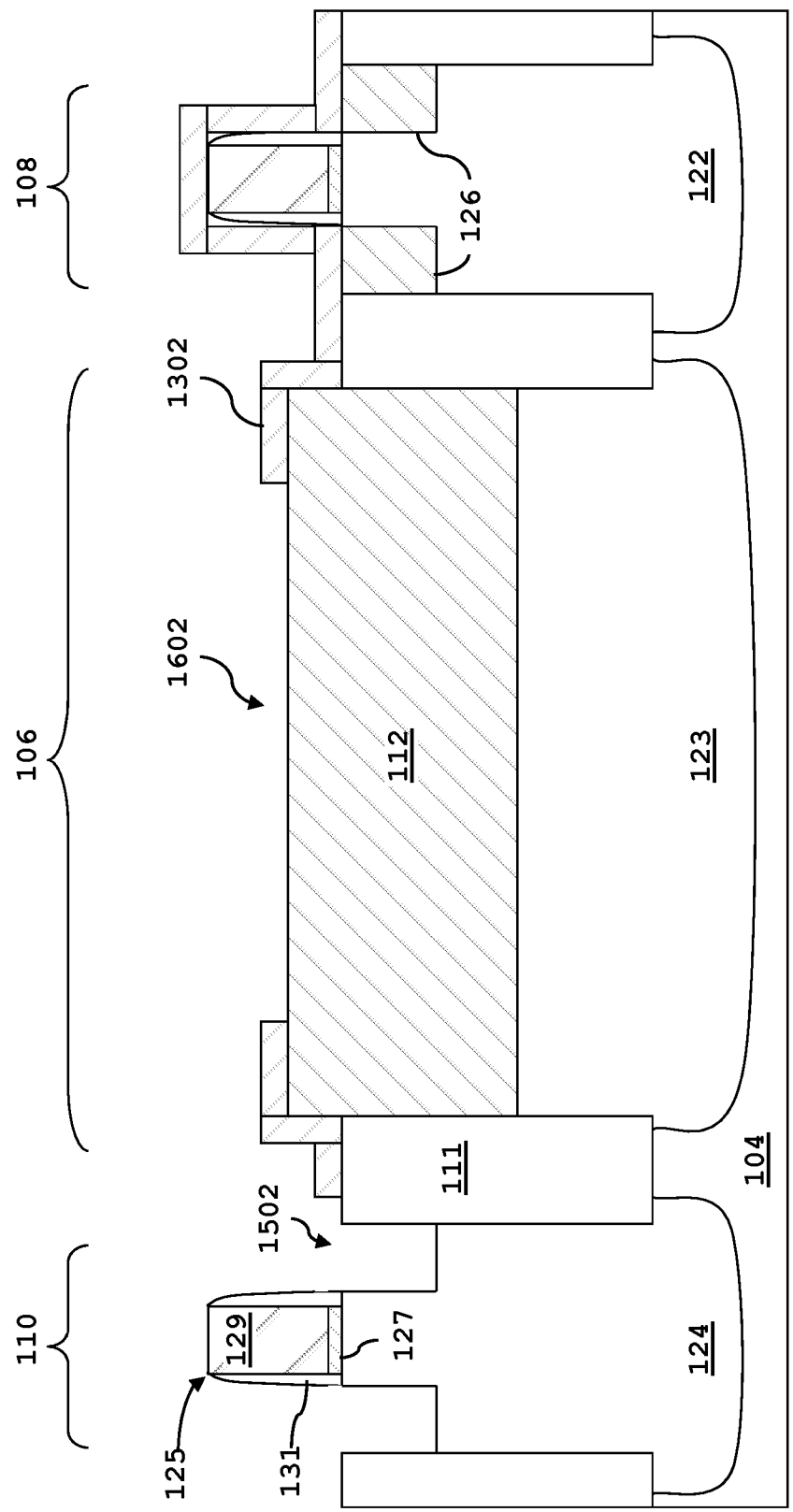
FIG. 22 shows a cross-sectional side view of the removal of an area of the second hard mask in the diode region.

FIG. 19 shows a cross-sectional side view of the formation of a second hard mask 1302 on top of the substrate 104, STI layers 111, first doped layer 112, and a gate structure 125. FIG. 20 shows a cross-sectional side view of the removal of the second hard mask 1302 from the second CMOS device region 110. FIG. 21 shows a cross-sectional side view of a portion of the substrate in the second CMOS device region 110 being recessed to form a second CMOS recessed area 1502. FIG. 22 shows a cross-sectional side view of the removal of an area 1602 of the second hard mask 1302 in the diode region 106.

Figure 23:
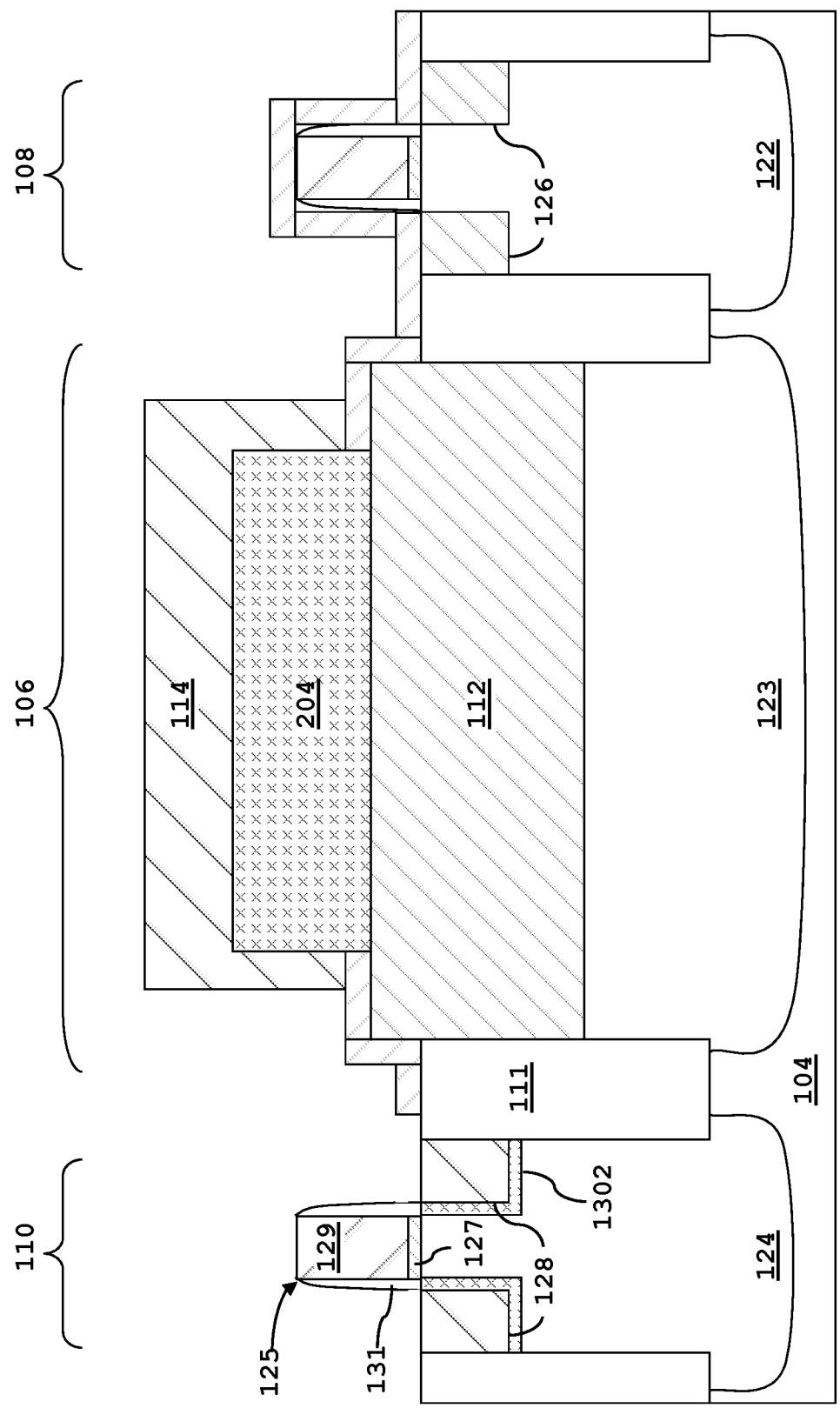
FIG. 23 shows a cross-sectional side view of the formation of middle undoped layer and a second doped layer.

FIG. 23 shows a cross-sectional side view of the formation of middle undoped layer 204 and a second doped layer 114.

The middle undoped layer 204 may be formed above the first doped layer 112 in the area 1602 where the hard mask has been removed. In one embodiment, an undoped CMOS layer 2302 is formed in the second CMOS recessed area 1502. The middle undoped layer 204 and undoped CMOS layer 2302 may be formed simultaneously. For example, the middle undoped layer 204 and undoped CMOS layer 2302 may be formed by an epitaxial process. The middle undoped layer 204 may be thicker than the undoped CMOS layer 2302. In one embodiment, the middle undoped layer 204 and the undoped CMOS layer 2302 are made of the same material. Suitable materials may include, for example, undoped silicon, silicon germanium, or a combination of silicon and carbon.

The second doped layer 114 may be formed above the middle undoped layer 204. In one embodiment, a second source-drain epitaxial layer 128 is formed in the second CMOS recessed area 1502. The second doped layer 114 and the second source-drain epitaxial layer 128 may be formed simultaneously. For example, the second doped layer 114 and the second source-drain epitaxial layer 128 may be formed epitaxially. In one embodiment, the second doped layer 114 and the second source-drain epitaxial layer 128 are formed of the same material. Suitable materials may include, for example, heavily doped n+ silicon or a combination of silicon and carbon.

Figure 24:
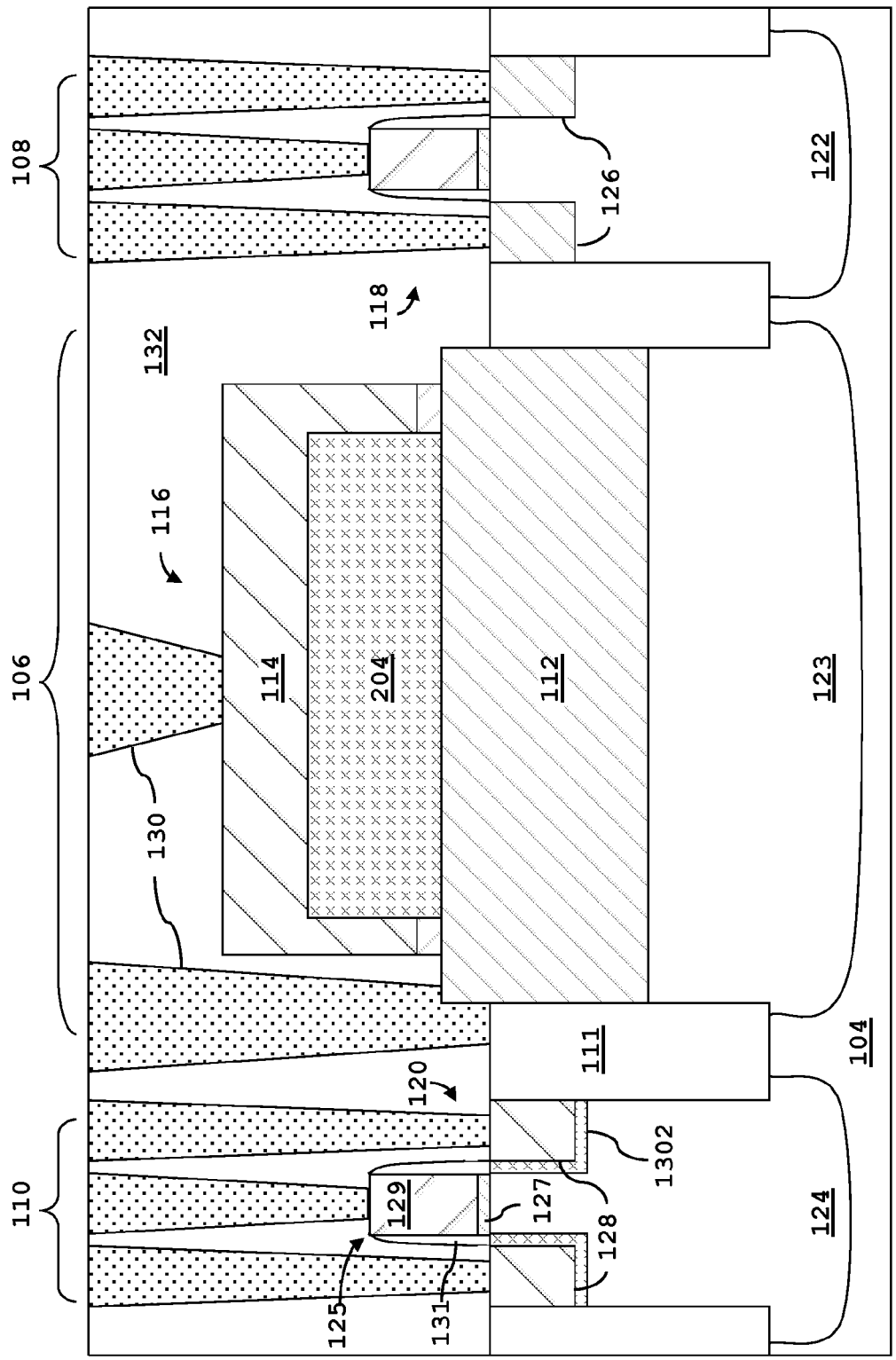
FIG. 24 shows a cross-sectional side view of an example embodiment of an electrical circuit after the completion of finalizing steps of a fabrication process.

FIG. 24 shows a cross-sectional side view of an example embodiment of an electrical circuit 2401 after the completion of finalizing steps of a fabrication process. The finalizing steps may include removing some or all of the remaining portions of the second hard mask 1302. After some or all of the remaining portions of the second hard mask 1302 are removed, silicide contacts may be formed. Then, vias 130 may be formed in a dielectric layer 132 to form an electric circuit 2403 including a planar diode 116, first CMOS device 118, and second CMOS device 120.

Figure 25:
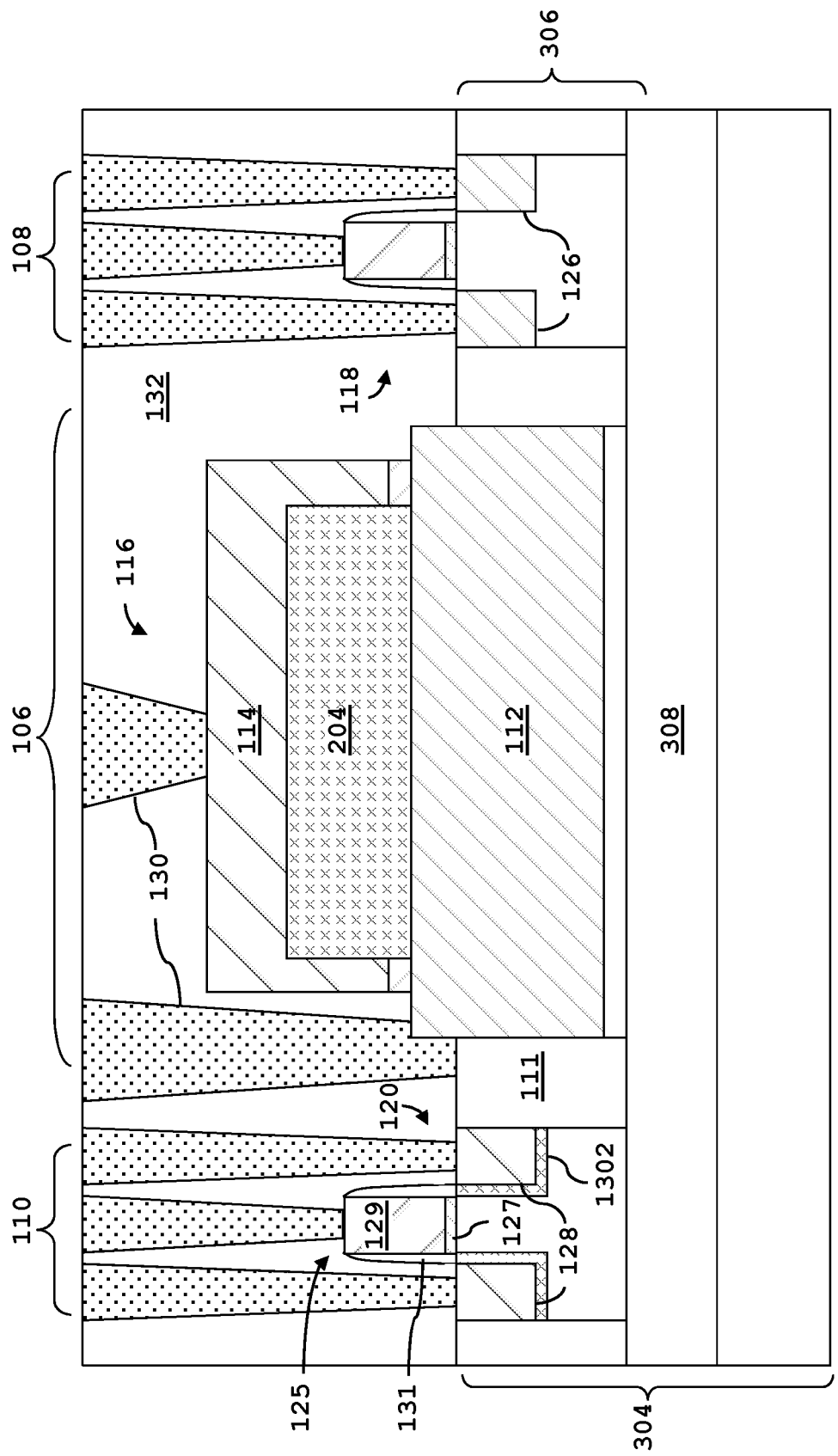
FIG. 25 shows a cross-sectional side view of an embodiment of an electrical circuit similar to the electrical circuit in FIG. 24.

FIG. 25 shows a cross-sectional side view of an embodiment of an electrical circuit 2502 similar to the electrical circuit 2402 in FIG. 24. The electrical circuit 2502 may be formed through a process similar to the process shown in FIGS. 7-11, and 18-24. In this embodiment, however, the substrate 304 may be a semiconductor on insulator (SOI) wafer. The SOI wafer may include a semiconductor layer 306 above an insulator layer 308. The STI layers 111 may extend to the insulator layer 308 of the SOI wafer.

The embodiments described above provided examples and details primarily relevant to formation of the first CMOS device as a pFET and the second CMOS device as an nFET, but other embodiments of the invention may include an nFET for a first CMOS device and a pFET for a second CMOS device. Additionally, the fabrication steps may be altered in order to form the second CMOS device before the first CMOS device.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method of forming a diode and at least one CMOS device on a same chip, the method comprising steps of:
   electrically isolating a portion of a substrate in a diode region from other substrate regions;
   recessing the substrate in the diode region;
   epitaxially forming in the diode region a first doped layer above the substrate;
   epitaxially forming in the diode region a second doped layer above the first doped layer;
   epitaxially forming in the diode region a middle undoped layer above at least a part of the first doped layer, wherein the second doped layer is formed above the middle undoped layer; and
   simultaneously epitaxially forming in the diode region the middle undoped layer and an external undoped layer outside the diode region as part of the at least one CMOS device.

2. The method of claim 1, wherein the first doped layer, the middle undoped layer and the second doped layer are configured together as a vertical PIN diode.

3. The method of claim 1, further comprising forming at least a part of the at least one CMOS device while forming the diode.

4. The method of claim 3, wherein recessing the substrate in the diode region includes simultaneously recessing at least one of the other substrate regions to a lesser extent than occurs in recessing the substrate in the diode region.

5. The method of claim 3, wherein at least one of epitaxially forming the first doped layer and epitaxially forming the second doped layer includes simultaneously epitaxially forming an external layer outside the diode region as part of the at least one CMOS device.

6. The method of claim 5, wherein the at least one CMOS device includes at least one of an nFET and a pFET and the external layer is a source-drain epitaxial layer of one of the nFET and the pFET.

7. The method of claim 1, wherein the substrate is a silicon on insulator wafer having a silicon layer above an insulator layer, the silicon layer being at least 40 nm thick.

8. The method of claim 1, wherein the first doped layer includes in-situ boron doped silicon germanium.

9. The method of claim 1, wherein the second doped layer includes at least one of in-situ phosphorus doped silicon and a combination of silicon and carbon.

10. The method of claim 1, wherein the first doped layer and the second doped layer are configured together as a vertical PN diode.

11. A method of forming a diode and at least one CMOS device on a same chip, the method comprising steps of:
    electrically isolating a portion of a substrate in a diode region from other substrate regions;
    recessing the substrate in the diode region;
    epitaxially forming in the diode region a first doped layer above the substrate; and
    epitaxially forming in the diode region a second doped layer above the first doped layer;
    wherein a width of the diode region is at least 10 times greater than a pitch of the at least one CMOS device.

12. The method of claim 11, further comprising:
    epitaxially forming in the diode region a middle undoped layer above at least a part of the first doped layer, wherein the second doped layer is formed above the middle undoped layer.

13. The method of claim 12, wherein the first doped layer, the middle undoped layer and the second doped layer are configured together as a vertical PIN diode.

14. The method of claim 11, further comprising forming at least a part of the at least one CMOS device while forming the diode.

15. The method of claim 14, wherein recessing the substrate in the diode region includes simultaneously recessing at least one of the other substrate regions to a lesser extent than occurs in recessing the substrate in the diode region.

16. The method of claim 14, wherein at least one of epitaxially forming the first doped layer and epitaxially forming the second doped layer includes simultaneously epitaxially forming an external layer outside the diode region as part of the at least one CMOS device.

17. The method of claim 16, wherein the at least one CMOS device includes at least one of an nFET and a pFET and the external layer is a source-drain epitaxial layer of one of the nFET and the pFET.

18. The method of claim 11, wherein the substrate is a silicon on insulator wafer having a silicon layer above an insulator layer, the silicon layer being at least 40 nm thick.

19. The method of claim 11, wherein the first doped layer includes in-situ boron doped silicon germanium.

20. The method of claim 11, wherein the second doped layer includes at least one of in-situ phosphorus doped silicon and a combination of silicon and carbon.

21. The method of claim 11, wherein the first doped layer and the second doped layer are configured together as a vertical PN diode.

22. The method of claim 11, further comprising:
simultaneously epitaxially forming in the diode region a middle undoped layer above at least a part of the first doped layer and an external undoped layer outside the diode region as part of the at least one CMOS device, wherein the second doped layer is formed above the middle undoped layer.

* * * * *